United States Patent
Gokay

(10) Patent No.: US 8,204,094 B2
(45) Date of Patent: Jun. 19, 2012

(54) SCALABLE, EFFICIENT LASER SYSTEMS

(75) Inventor: M. Cem Gokay, Dayton, OH (US)

(73) Assignee: Innova, Inc., Centerville, OH (US)

( * ) Notice: Subject to any disclaimer, the term of this patent is extended or adjusted under 35 U.S.C. 154(b) by 217 days.

(21) Appl. No.: 12/732,746

(22) Filed: Mar. 26, 2010

(65) Prior Publication Data

US 2011/0075687 A1  Mar. 31, 2011

Related U.S. Application Data

(60) Provisional application No. 61/171,308, filed on Apr. 21, 2009.

(51) Int. Cl.
*H01S 3/091* (2006.01)
*H01S 3/09* (2006.01)
*H01S 5/00* (2006.01)

(52) U.S. Cl. ............... 372/71; 372/39; 372/41; 372/69; 372/72

(58) Field of Classification Search .................... 372/39, 372/41, 69–72
See application file for complete search history.

(56) References Cited

U.S. PATENT DOCUMENTS

| | | | |
|---|---|---|---|
| 3,995,376 A | 12/1976 | Kimble et al. | |
| 4,266,873 A | 5/1981 | Hacskaylo et al. | |
| 4,273,536 A | 6/1981 | Wick | |
| 4,452,458 A | 6/1984 | Timander et al. | |
| 4,464,115 A | 8/1984 | Simpson et al. | |
| 4,737,106 A | 4/1988 | Laciny | |
| 4,949,346 A * | 8/1990 | Kuper et al. | 372/36 |
| 4,959,016 A | 9/1990 | Lawrence | |
| 5,307,053 A | 4/1994 | Wills et al. | |
| 5,377,212 A | 12/1994 | Tatsuno et al. | |
| 5,605,461 A | 2/1997 | Seeton | |
| 5,788,500 A | 8/1998 | Gerber | |
| 6,331,993 B1 | 12/2001 | Brown | |
| 6,549,872 B2 | 4/2003 | Bollweg et al. | |
| 6,822,994 B2 * | 11/2004 | Kennedy | 372/66 |
| 6,870,902 B2 * | 3/2005 | Angliss et al. | 379/27.06 |
| 7,003,011 B2 | 2/2006 | Kafka et al. | |
| 7,457,328 B2 | 11/2008 | Holtom | |
| 7,516,571 B2 | 4/2009 | Scrogin et al. | |
| 7,529,286 B2 | 5/2009 | Gokay et al. | |

(Continued)

OTHER PUBLICATIONS

International Search Report and Written Opinion as it relates to PCT application No. PCT/US2010/031698 dated Dec. 7, 2010.

*Primary Examiner* — Jessica Stultz
*Assistant Examiner* — Phillip Nguyen
(74) *Attorney, Agent, or Firm* — Dinsmore & Shohl LLP

(57) ABSTRACT

A laser comprises an end pump light source and a gain medium having a first end, a second end, and four sides comprising a first, a second, a third, and a fourth side. The end pump light source is optically coupled to the first end and pumps the gain medium. The first side and the third side are tapered inwardly from the first end to the first end to the second end at a taper angle β relative to a longitudinal lasing axis and have a polished finish capable of reflecting light inside the gain medium. The second side and the fourth side are substantially parallel to the longitudinal lasing axis have a ground blasted finish. The first side is also tilted inwardly at a slant angle α from the fourth side to the second side. A laser beam $R_0$ exits the second end of the gain medium.

14 Claims, 17 Drawing Sheets

U.S. PATENT DOCUMENTS

| | | | |
|---|---|---|---|
| 7,530,192 B2 | 5/2009 | Grauslys et al. | |
| 2001/0033588 A1 | 10/2001 | Broderick et al. | |
| 2002/0105997 A1 | 8/2002 | Zhang | |
| 2002/0176471 A1* | 11/2002 | Peressini | 372/70 |
| 2003/0063884 A1 | 4/2003 | Smith et al. | |
| 2004/0005531 A1 | 1/2004 | Varshneya et al. | |
| 2004/0114657 A1 | 6/2004 | Vetrovec | |
| 2004/0240500 A1 | 12/2004 | Mercer | |
| 2005/0152426 A1 | 7/2005 | Dell'Acqua et al. | |
| 2006/0153257 A1 | 7/2006 | Franjic et al. | |
| 2006/0280505 A1 | 12/2006 | Varshneya et al. | |
| 2007/0201532 A1 | 8/2007 | Zhang et al. | |
| 2007/0217470 A1 | 9/2007 | DeFranza et al. | |
| 2009/0220239 A1 | 9/2009 | Armstrong et al. | |

* cited by examiner

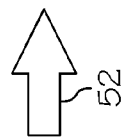
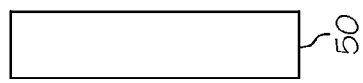
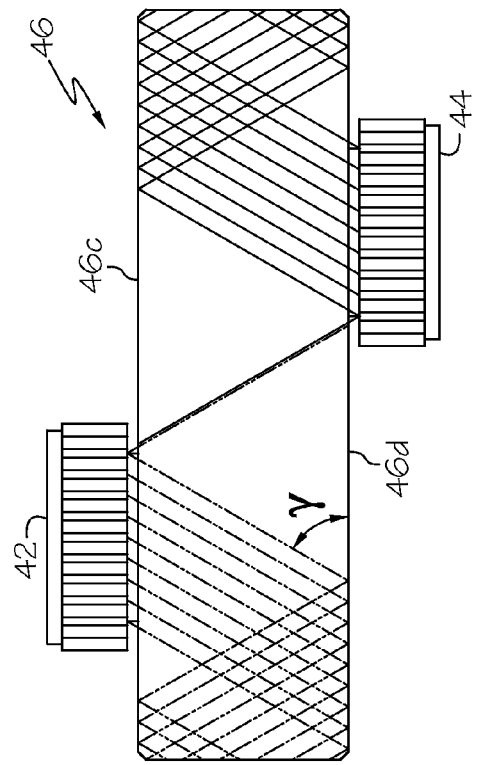
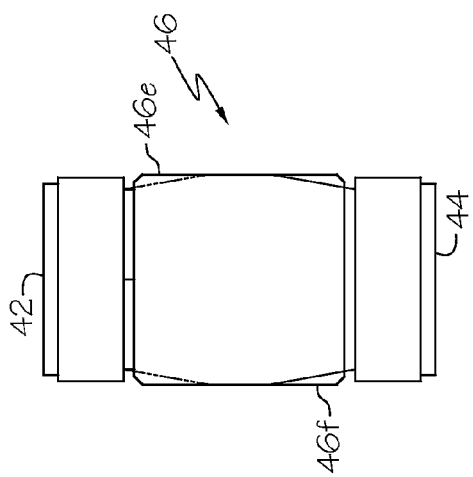
FIG. 13A
FIG. 13B

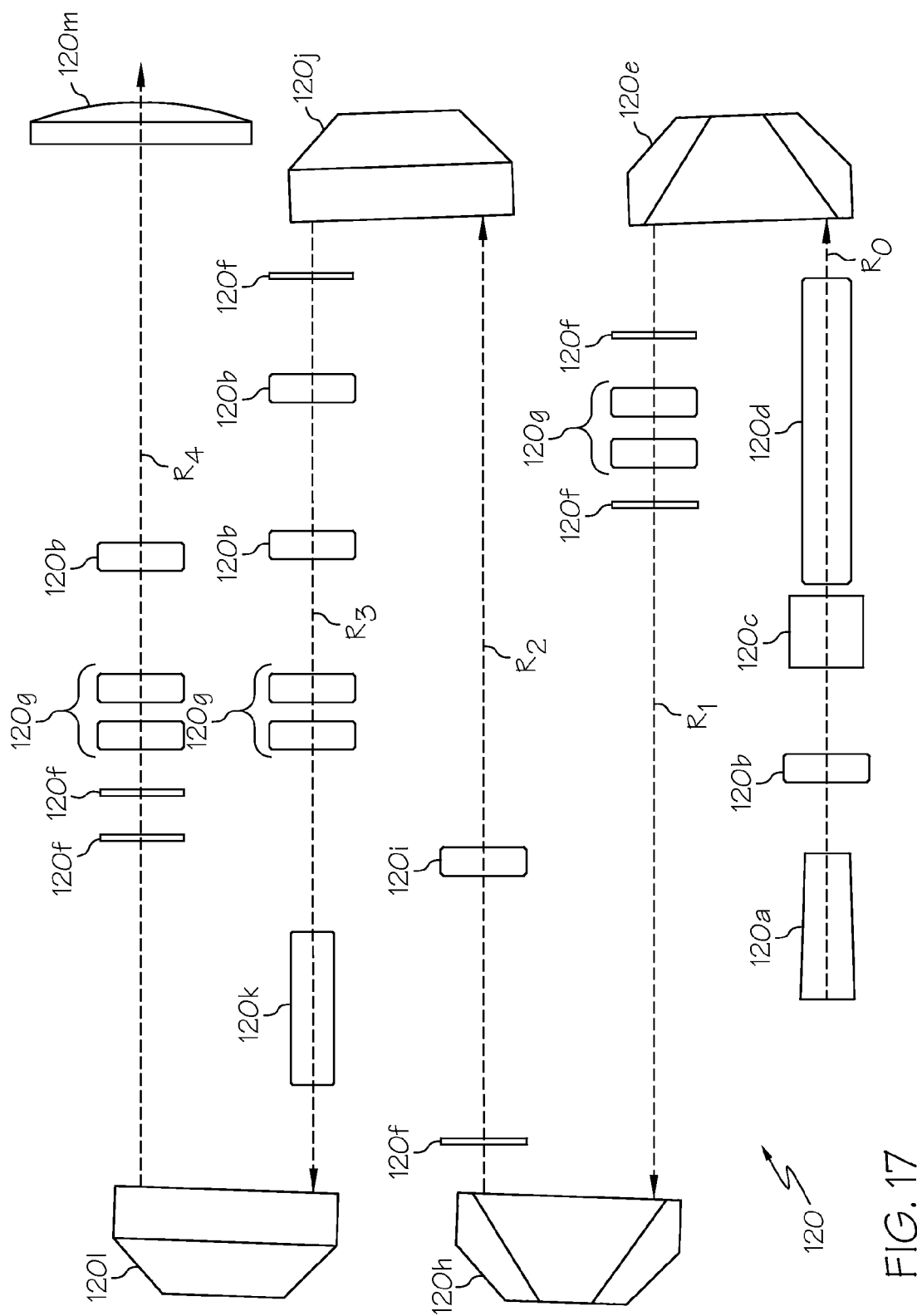

SCALABLE, EFFICIENT LASER SYSTEMS

CROSS REFERENCE TO RELATED APPLICATIONS

This application claims the benefit of U.S. Provisional Application No. 61/171,308, filed Apr. 21, 2009.

TECHNICAL FIELD

The present invention generally relates to lasers and, particularly, to scalable, efficient, diode pumped lasers.

BACKGROUND

As background, a laser produces a beam of light having a particular wavelength, phase, and/or polarization. The laser may comprise a pump light source and a gain medium. Light from the pump light source may be transmitted into the gain medium to provide energy to produce and amplify the laser beam. Due to the energy levels involved in the creation of the laser beam, the light sources and/or the gain medium may generate a relatively large amount of heat energy. This may require cooling devices, such as heat sinks, to be attached to the laser or may require that the power level of the laser beam be reduced in order to insure that components of the laser do not become overheated. Therefore, laser systems are needed which are more efficient, reduce the amount of heat generated, have lower weight and volume, may be miniaturized, and may be multiplexed or scaled according to the application.

SUMMARY

In one embodiment, a laser comprises an end pump light source and a gain medium having a first end, a second end, and four sides comprising a first side, a second side, a third side, and a fourth side, wherein: the end pump light source is optically coupled to the first end and pumps the gain medium; the four sides are disposed between the first end and the second end such that the first side and the third side oppose each other and the second side and the fourth side oppose each other; the first side and the third side are tapered inwardly from the first end to the first end to the second end at a taper angle β relative to a longitudinal lasing axis and have a polished finish capable of reflecting light inside the gain medium; the second side and the fourth side are substantially parallel to the longitudinal lasing axis, are substantially perpendicular to the first end and the second end, and have a ground blasted finish; the first side is tilted inwardly at a slant angle α from the fourth side to the second side, the second side is substantially perpendicular to the third side, and the third side is substantially perpendicular to the fourth side; and a laser beam $R_0$ exits the second end of the gain medium.

In another embodiment, a laser comprises two side pump light sources and a gain medium having a first end, a second end, and four sides comprising a first side having a first aperture area, a second side, a third side having a second aperture area, and a fourth side, wherein: the first end and the second end are substantially perpendicular to a longitudinal lasing axis of the gain medium and have a polished finish; the four sides are disposed between the first end and the second end such that the first side and the third side oppose each other and the second side and the fourth side oppose each other; the first side is substantially perpendicular to the second side, the second side is substantially perpendicular to the third side, the third side is substantially perpendicular to the fourth side, and the fourth side is substantially perpendicular to the first side; the four sides are substantially parallel to the longitudinal lasing axis, are substantially perpendicular to the first end and the second end, have length L parallel to the longitudinal lasing axis, and have a ground blasted finish except in the first aperture area and the second aperture area; the first aperture area and the second aperture area each have a length parallel to the longitudinal lasing axis that is less than or equal to 0.5×L, have a polished finished, and are optically coupled to the two side pump light sources such that the two side pump light sources pump the gain medium; the first aperture area is disposed in the first side and the second aperture area is disposed in the third side so as to be staggered; and a laser beam $R_0$ exits the second end of the gain medium.

In yet another embodiment, a laser comprises an end pump light source and a gain medium having a first end, a second end, and four sides comprising a first side, a second side, a third side, and a fourth side, wherein: the first end and the second end are substantially perpendicular to a longitudinal lasing axis of the gain medium and have a polished finish; the four sides are disposed between the first end and the second end such that the first side and the third side oppose each other and the second side and the fourth side oppose each other; the first side and the third side are tapered inwardly from the first end to the first end to the second end at a taper angle β relative to the longitudinal lasing axis and have a polished finish capable of reflecting light inside the gain medium; the second side and the fourth side are substantially parallel to the longitudinal lasing axis, are substantially perpendicular to the first end and the second end, and have a ground blasted finish; the first side is tilted inwardly at a slant angle α from the fourth side to the second side, the second side is substantially perpendicular to the third side, and the third side is substantially perpendicular to the fourth side; the end pump light source comprises a plurality of light-emitting diodes producing light at a plurality of wavelengths; the end pump light source is optically coupled to the first end of the gain medium, pumps the gain medium, and is oriented such that light exiting the end pump light source at a relatively high exit angle is directed toward the first side and the third side; and a laser beam exits the second end of the gain medium.

These and additional features provided by the embodiments of the present invention will be more fully understood in view of the following detailed description, in conjunction with the drawings.

BRIEF DESCRIPTION OF THE DRAWINGS

The embodiments set forth in the drawings are illustrative in nature and not intended to limit the inventions defined by the claims. The following detailed description of the illustrative embodiments can be understood when read in conjunction with the following drawings, where like structure is indicated with like reference numerals and in which:

FIGS. 13A depicts a top view and 13B depicts an end view of a side pumped laser according to one or more embodiments shown and described herein;

FIG. 17 depicts a schematic representation of a miniaturized, folded, end pumped, scalable laser according to one or more embodiments shown and described herein;

DETAILED DESCRIPTION

Figure 1:
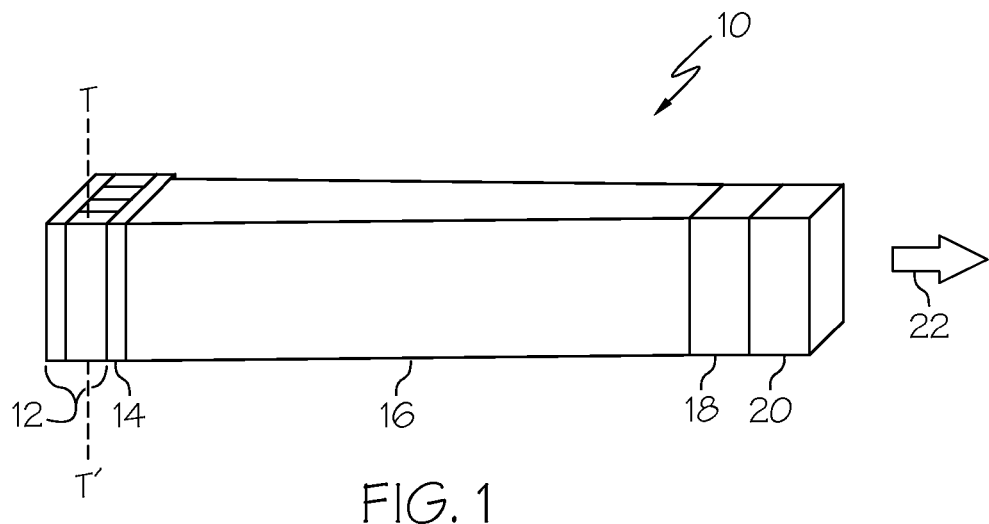
FIG. 1 depicts a perspective view of an end pumped laser according to one or more embodiments shown and described herein.

Although many lasers available on the market today may claim to be scalable, they may not be capable of being miniaturized as well. That is, they are not capable of being reduced in size and weight while keeping the same level of output power. Consequently, they may not be suitable for many types of applications where physical size, weight, and/or efficiency, including thermal management issues, are important. Furthermore, existing lasers may not be capable of efficiently pumping the gain medium over a wide temperature range due to the temperature coefficient of the pump light source, in which the wavelength of the light produced may change over temperature. These deficiencies in existing systems may also reduce the quality of the laser beam produced. Therefore, one or more embodiments shown and described herein provide scalable, efficient lasers which support many types of gain media such as, for example, Nd:YAG, Er:YAG, Er:GLASS, and similar gain media. These lasers may be scaled both from a physical standpoint as well as a power level standpoint and may efficiently produce a high-quality laser beam over a wide temperature range.

The embodiments described herein permit the design and implementation of a high-beam-quality, distributed gain, efficient, end pumped oscillator module (also called pump head module) as well as uniform, efficient, side pumped amplifier modules. Further improvements to one or more of these modules may increase thermal resistance (e.g., 30% improvement) and achieve up to two times higher pulse energies. Such laser systems include a miniature 19.5-gram Nd:YAG oscillator pump head module which was efficiently end pumped and produced a 1064-nm laser beam over a wide temperature range. The output power level is approximately 10 millijoules (mJ) and was only limited by laboratory condensing temperatures. Another embodiment of a laser system may include a 210-mm-long gain medium to produce an electro-optic-Q-switched Nd:YAG laser beam having at least 12 mJ of energy per pulse at 1064 nm (up to 20 Hz) and having a pulse width of 17-19 ns FWHM (i.e., full width at half maximum). An analysis of the laser beam indicated a normal mode beam profile at maximum normal mode output of 15.7 mJ per pulse without any circular aperture.

Accordingly, embodiments described herein generally relate to scalable, efficient lasers and, in particular, to lasers which are diode pumped. The laser may operate in either continuous wave ("CW") mode, in which a laser beam is continuously produced, or in a pulsed ("QCW") mode, in which a laser beam is produced only at certain times or under certain conditions. When operating in QCW mode, the laser may include an active or a passive Q-switch which may be optically coupled to the laser gain medium and may efficiently facilitate the pulsed operation. If an active Q-switch is used, it may comprise either an electro-optic (EO) or acousto-optic (AO) Q-switch. The laser may have one or more pump light sources comprising one or more multi-light-emitting diodes or bars; additional light sources may be added to scale (i.e., increase) the output power level of the laser. Amplifier modules may be added to the laser in order to further scale the power level of laser according to the needs of the application. Furthermore, embodiments of the laser may include thermally-conductive, optically-transparent devices which operate to remove heat generated by the operation of the laser, particularly from the gain medium and the pump light source. As such, the illustrative laser embodiments shown and described herein may have further improved efficiency, increased average power, increased operating temperature range, and reduced size and/or weight characteristics.

Referring to FIG. 1, one embodiment of a laser 10 may comprise a pump light source 12, a mirror element 14, a gain medium 16, a Q-switch 18, and an output coupler 20. In this embodiment, the pump light source 12 is disposed at one end of the gain medium 16 and thus comprises an end pump light source. The laser 10 may be operable to produce a laser beam 22 either in CW or QCW mode. As used in this disclosure, stating that two elements are "optically coupled" means that elements are physically disposed such that some or all of an optical emission (e.g., light or laser beam) from one of the elements is transferred to or reflected by the other element (or vice versa) optically coupled thereto. When two elements are optically coupled, they may be in physical contact with each other, attached to each other, and/or suitably aligned (e.g., disposed relative to one other) to achieve the desired result. In the embodiment of FIG. 1, the pump light source 12 may be optically coupled to the mirror element 14, which may be optically coupled to the gain medium 16. In this embodiment, the pump light source 12 may be optically coupled to the gain medium 16 through the mirror element 14 such that light emitted by the pump light source 12 is directed into the gain medium 16. The gain medium may be optically coupled to the Q-switch 18, which may be optically coupled to the output coupler 20. In embodiments which do not require a Q-switch 18, the gain medium 16 may be optically coupled (i.e., directly) to the output coupler 20.

The operation of the laser 10 may be as follows. The pump light source 12 may produce light which passes through the minor element 14 and enters the gain medium 16. The process of supplying the energy required to amplify the laser beam is called "pumping." The pump light source 12 produces light (i.e., energy or power), some or all of which may be directed into the gain medium 16 through the efficiently coated minor element 14 so as to amplify or "pump" the laser light therein. This may produce an amplified laser beam 22 having particular characteristics, such as power level, wavelength, phase, and polarization. The Q-switch 18 may facilitate operation of the laser 10 in QCW mode. Alternatively, the Q-switch 18 may be omitted if only CW mode operation is required. The output coupler 20 may be used to facilitate the operation of the laser 10 by reflecting some of the laser light contained in the gain medium 16 to create the amplified stimulated emission while allowing the remaining laser light to pass through it so as to form a laser beam 22.

Figure 2:
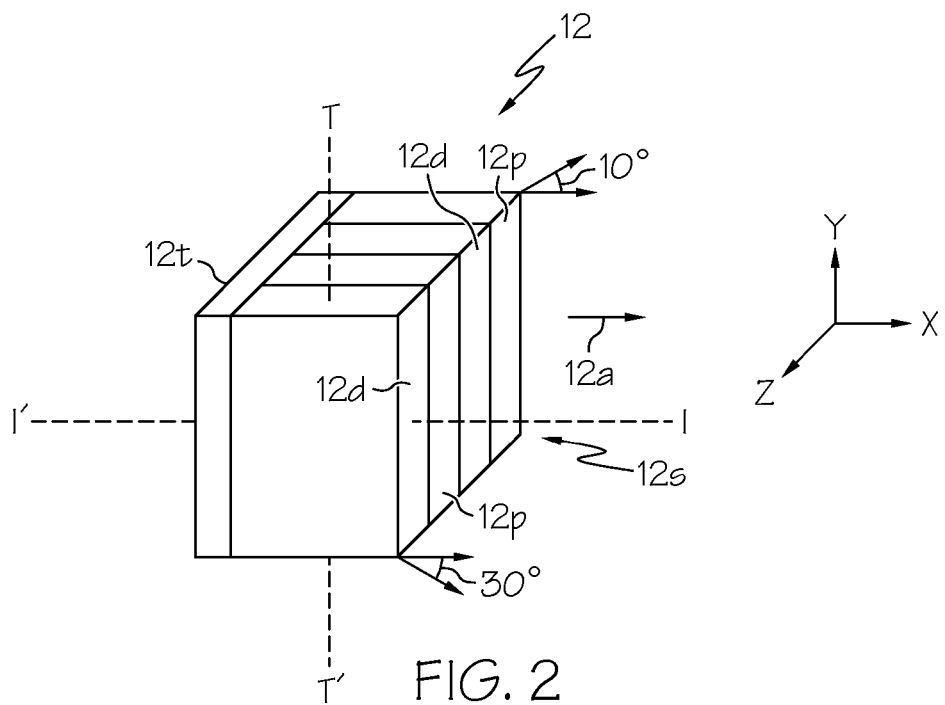
FIG. 2 depicts a perspective view of a pump light source according to one or more embodiments shown and described herein.
Figure 9:
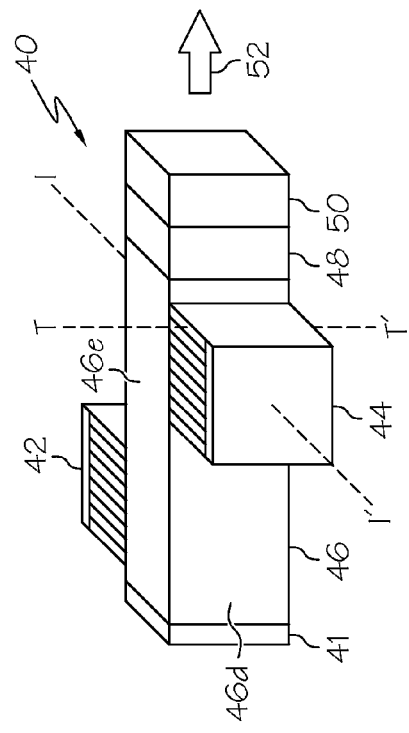
FIG. 9 depicts a perspective view of a side pumped laser according to one or more embodiments shown and described herein.

Referring to FIG. 2, an embodiment of the pump light source 12 is shown. The pump light source 12 may be used to either end pump the laser, as shown in FIG. 1, or side pump the laser, as shown in FIG. 9. The pump light source 12 may also be referred to as a pump diode/light source. Thus, the pump light source 12 may be called an "end" pump light source if it is used to end pump the laser or a "side" pump light source if it is used to side pump the laser. The characteristics of the pump light source 12, described below, apply to either an end pump light source or a side pump light source.

In general, the pump light source 12 may comprise one or more semiconductor diodes bars 12d with a high density (e.g., 90% fill factor) of single emitters stacked in an alternating pattern with one or more spacers 12p positioned between each diode bar 12d. The spacers 12p may be thermally conductive so as to provide a mechanism to remove heat from each diode bar 12d and from the pump light source 12 when it is operating. When an electrical current is applied to the diode bars 12d, light 12a may be produced which can be transmitted into the gain medium 16, thus pumping (i.e., amplifying) the laser light contained within the gain medium 16. The pump light source 12 may also have a thermal mount 12t which may provide a mounting structure for the diode bars 12d and spacers 12p as well as providing a thermal path to facilitate the removal of heat from the pump light source 12. The thermal mount 12t may be metal, ceramic, or other suitable material.

The pump light source 12 may have a plurality of diode bars 12d. Each diode bar 12d may emit light at approximately the same wavelength such as, for example, 808 nanometers (nm) which may optimize the efficiency of a gain medium comprising an Nd:YAG crystal. In other embodiments, the diode bars 12d may emit light at some other wavelength suitable for efficient pumping of other types of gain media. Instead of all the diode bars 12d emitting light at the same wavelength, the diode bars 12d may emit light at two or more different wavelengths. That is, some diode bars 12d may emit light at one wavelength while other diode bars 12d emit light at one or more different wavelengths. Thus, a single pump light source 12 may be capable of producing light at two or more different wavelengths at the same time. Furthermore, the pump light source 12 may comprise any suitable number of diode bars 12d.

A pump light source 12 which emits light at multiple wavelengths may have several advantages. First, the wavelength of the light emitted by a diode bar may have a temperature coefficient of approximately 0.3 nm/C to approximately 0.4 nm/C. For example, a diode bar emitting light at 808 nm at one temperature may emit light at 812 nm if the temperature increases or decreases by 10 degrees C. The gain medium may have a relatively narrow range of wavelengths in which the laser beam is efficiently produced such as, for example, 808 nm±3 nm. Thus a pump light source 12 which emits light at a single wavelength, like 808 nm, may drift out of the efficient wavelength range of the gain medium if the temperature changes significantly. Consequently, it may be advantageous to design a pump light source 12 which has diode bars 12d that emit light at multiple wavelengths. Having diode bars 12d emitting different wavelengths may allow at least one diode bar in the pump light source 12 to emit light at the suitable wavelength to efficiently produce laser light (e.g., 808 nm±3 nm). As an example, a pump light source 12 may have 12 diode bars 12d, numbered 1 through 12; diode bar 1 may emit light at a wavelength of 804 nm at 25 degrees C., diode bar 2 may emit light at a wavelength of 808 nm at 25 degrees C., and diode bar 3 may emit light at a wavelength of 812 nm at 25 degrees C. This pattern may be repeated for diodes 4-6, 7-9, and 10-12. In this example, at least four diodes will emit light at 808 nm±3 nm (i.e., 805 nm to 811 nm, even if the temperature changes from 25 degrees C. by plus or minus 10 degrees C. Other embodiments of the pump light source 12 are possible, including those having diode bars 12d producing light at many different wavelengths so that at least one of the diode bars 12d emits light a suitable wavelength to efficiently pump the gain medium over a wide temperature range.

A second advantage of a pump light source 12 which emits light at multiple wavelengths is that one of the wavelengths may be used to control the passive Q-switch (described below). For example, one or more of the diode bars 12d in the pump light source 12 may emit light at 940 nm which may be a wavelength of light absorbed by the passive Q-switch (e.g., Cr:YAG). In this example, the amount of light emitted at 940 nm (as determined by, for example, the amount of electrical current applied to the corresponding diode bar 12d) may determine when the passive Q-switch operates so as to allow a pulse of a laser beam to be emitted by the laser in CW or QCW mode. Generally, only passive Q-switches may be controlled in this fashion, while active Q-switches are controlled directly via a processor or other controller circuit (which may be relatively large and require high levels of power). In summary, the pump light source 12 may be capable of emitting light at multiple wavelengths, including one or more wavelengths near the optimal wavelength for pumping the gain medium as well as one or more wavelengths near the operating wavelength of the passive Q-switch.

Much of the light 12a produced by the diode bars 12d may exit at an angle that is substantially perpendicular to a surface 12s of the pump light source 12. Some of the light 12a may also exit at an angle up to about 10 degrees in the transverse direction as shown in FIG. 2 (e.g., approximately 10 degrees from the X-axis in the X-Y plane). Furthermore, some of the light 12a may exit at an angle up to about 30 degrees in the longitudinal direction (e.g., 30 degrees from the X-axis in the X-Z plane). This may be a characteristic of the diode bars 12d and may vary, depending on the design of the pump light source 12. It is contemplated that exit angles more or less than those given above are possible as well. As such, one or more embodiments herein orient the diode bars 12d relative to produced light 12a and thus the gain medium's lasing axis L-L' in order to more efficiently direct the light 12a within the gain medium and its specific surfaces. As an example, the pump light source 12 shown in FIG. 2 illustrates the diode bars 12d with a transverse axis T-T' that is transverse to the pump light source's longitudinal axis l-l' ("transverse diode bars" and/or "transverse pump light source").

Referring to FIGS. 1 and 2, the physical dimension of the pump light source 12 may be such that it corresponds to the dimension of the first end of the gain medium 16 and/or minor element 14 to which the pump light source 12 may be optically coupled. The pump light source 12 may be attached to the gain medium 16 and/or mirror element 14 using a variety of known methods such as, for example, brackets and fasteners. Furthermore, a gap may be introduced between the pump light source 12 and the minor element 14 or gain medium 16. This gap may be relatively small (e.g., 0.001 to 0.005 inches) or may be suitably adjusted to optimize amount of coupling of the light 12a into the input end face (e.g., first end 16a) of a rectangular-shaped gain medium 16.

The pump light source 12 may comprise a transverse diode array, as shown in FIG. 2. However, the pump light source 12 may comprise other types of light sources as well and may be constructed in any suitable, transverse rectangular geometry defined by the divergence of each emitter. For example, a non-bar version of a single emitter configuration with an even number of longitudinal emitters with suitable two directional divergences for a square or rectangular pump light pattern may form the diode array and may be used as a pump light source 12. It is also contemplated that the pump light source 12 may comprise any suitable pump light source, including those known in the art as well as those yet to be discovered.

Referring again to FIG. 1, the laser may comprise a mirror element 14 which may be disposed between, and optically coupled to, the pump light source 12 and the gain medium 16. The mirror element 14 may be operable to pass light 12a from the pump light source 12 into the gain medium 16, but to reflect most or all of the laser light in the gain medium 16. Accordingly, the minor element 14 may be coated on a surface or multiple surfaces with a high reflectivity (HR) coating which may operate to reflect laser light in the gain medium 16. HR coatings that may be used herein may comprise any conventional or yet-to-be developed HR coatings that provide the desired reflectivity as would be known by one of ordinary skill in the art. Furthermore, the mirror element 14 may be coated on a surface or multiple surfaces with an anti-reflection (AR) coating, such as magnesium fluoride or other suitable material. The AR coating may allow light 12a (e.g., light having one or more particular wavelengths) from the pump light source 12 to pass into the gain medium 16 with little or no back reflections or attenuation (e.g., 0.25% reflection or less). Such light 12a (produced by the pump light source 12) may have a wavelength of approximately 808 nm, for example. However, the mirror element 14 may be highly reflective (approximately 99.98%) of the laser light within the gain medium 16, which may have a wavelength of approximately 1064 nm (for a gain medium 16 comprising an Nd:YAG crystal) or approximately 1540 nm (for a gain medium 16 comprising an Er:GLASS crystal). Although the minor element 14 may be a discrete component, it may also be integrated as part of the end face of the gain medium 16 such that the end face of the gain medium 16 embodies these optical characteristics. In the embodiment depicted in FIG. 1, the minor element 14 is shown as a discrete element.

Referring to FIGS. 1 and 3-5, the gain medium 16 may comprise a crystalline solid which may (or may not) be doped with a suitable ion or ions. For example, the gain medium 16 may comprise a crystal of yttrium, aluminum, and garnet (YAG) which has been doped with neodymium (Nd) at a specific concentration (varying from 0.6% to 1.2% or higher for a ceramic version) depending on the power delivered by the pump light source 12 and the length of the gain medium 16. Such a gain medium may be referred to as "Nd:YAG." Other suitable crystals may be used, including but not limited to yttrium orthovanadate ($YVO_4$) and yttrium lithium fluoride (YLF). Furthermore, other doping materials such as, but not limited to, erbium (Er) and ytterbium (Yb) may also be used. As an example, the gain medium 16 may comprise a crystal of YAG doped with Er (i.e., Er:YAG), Er:GLASS, or other types of optically-excitable gain media.

The gain medium 16 may comprise a first end 16a, a second end 16b, a longitudinal lasing axis L-L', and four sides (e.g., first side 16c, second side 16e, third side 16d, and fourth side 16f) positioned between the first and second ends 16a and 16b, respectively. The first end 16a and second end 16b may be substantially parallel to each other and substantially perpendicular to the longitudinal lasing axis L-L'. The minor element 14 may be optically coupled to the first end 16a of the gain medium 16. Alternatively, if the characteristics of the mirror element 14 are integrated into the first end 16a of the gain medium 16, the pump light source 12 may be optically coupled directly to the first end 16a (i.e., the discrete mirror element 14 may be omitted).

For the purposes of this disclosure, when stating that "the first end 16a is parallel to the second end 16b," it is to be understood that they are to be considered parallel to within a quarter wavelength of the laser beam (i.e., $0.25 \times \lambda$) per inch. Similarly, when stating that the first end 16a and the second end 16b are "substantially perpendicular to the longitudinal lasing axis L-L'," it is to be understood that they are to be considered perpendicular to within a quarter wavelength of the laser beam per inch. For example, if the wavelength of the laser beam 22 is 1064 nm, the first end 16a and second end 16b may be parallel to each other such that the error in parallelism is less than 266 nm per inch. Also for the purposes of this disclosure, stating that two elements (other than the first end 16a and the second end 16b as described above) are "substantially parallel" or "substantially perpendicular" means that they are to be considered to be within ±0.1° of being exactly parallel or exactly perpendicular, respectively.

Figure 3:
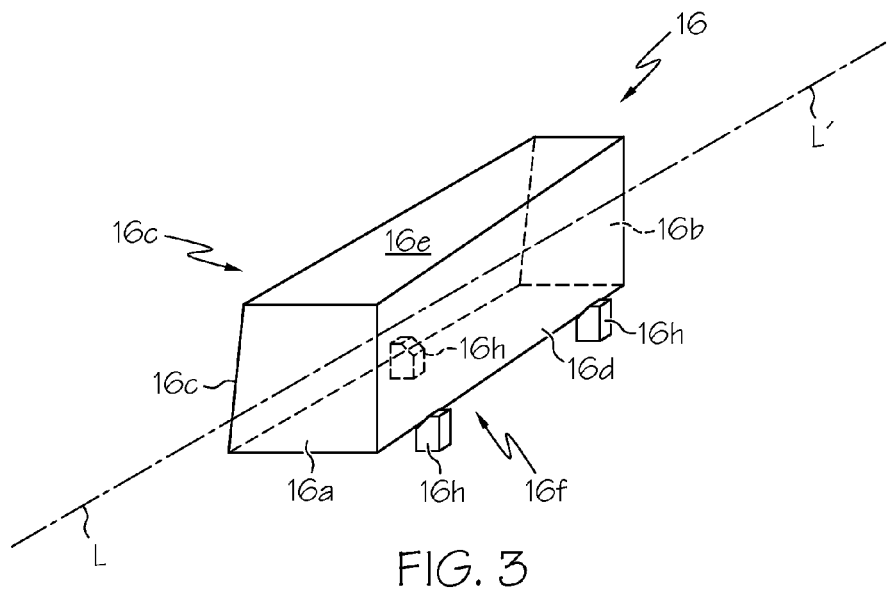
FIG. 3 depicts a perspective view of a gain medium operable for use with an end pump light source according to one or more embodiments shown and described herein.
Figure 4:
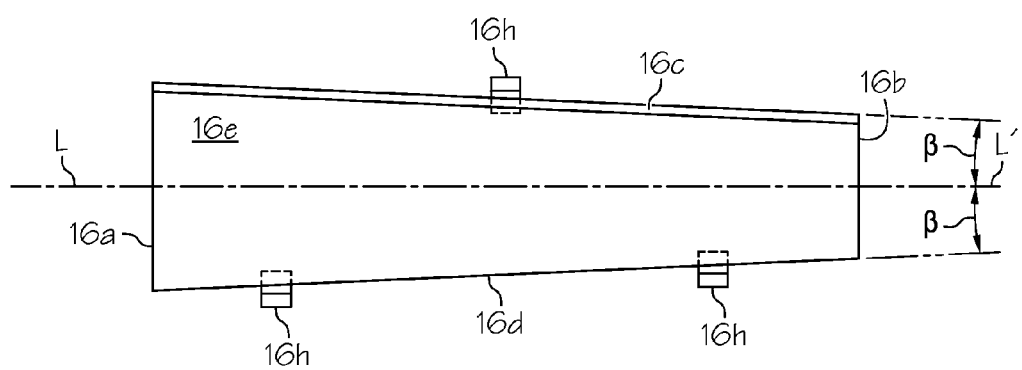
FIG. 4 depicts a top view of the gain medium of FIG. 3.
Figure 5:
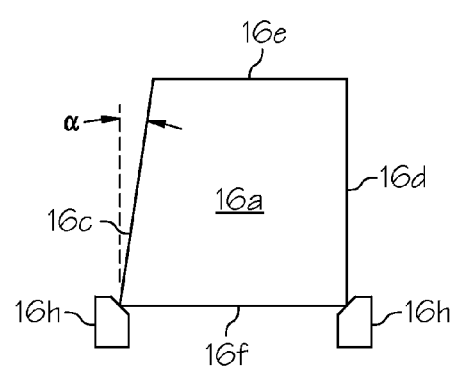
FIG. 5 depicts an end view of the gain medium of FIG. 3.

In the embodiment shown in FIGS. 3-5, first side 16c and third side 16d are opposite one another, forming a pair of opposed sides. Similarly, second side 16e and fourth side 16f are also opposite one another, forming another pair of opposed sides. In general, if two sides are described as "opposed" or that they "oppose each other," it is to be understood that they are on opposite sides of the longitudinal lasing axis L-L' of the gain medium 16 and may or may not be parallel to each other and/or the longitudinal lasing axis L-L'. Each of the four sides of the gain medium 16 may have a polished or ground blasted finished. If a side has a polished finish, it may internally reflect the laser light; if a side has a ground blasted finish, it may absorb the laser light inside the gain medium 16 and may be used for thermal extraction or mechanical mounting.

In the embodiment shown in FIGS. 3-5, the first side 16c and the third side 16d taper inwardly from the first end 16a to the second end 16b at a taper angle β relative to the longitudinal lasing axis L-L'. Thus, they are neither parallel to each other nor to the longitudinal lasing axis L-L'. As also shown, the second and fourth sides 16e and 16f, respectively, are substantially parallel to each other and to the longitudinal lasing axis L-L'. The sides that taper inwardly (i.e., 16c and 16d) may have the same taper angle β relative to the longitudinal lasing axis L-L'. Alternatively, these two sides may be tapered at a different taper angle (e.g., $\beta_1$ and $\beta_2$). In the embodiments shown in FIGS. 1, 3, and 4, the sides that taper inwardly (i.e., 16c and 16d) have the same taper angle β. The taper angle β may generally range from approximately 0.5° to approximately 5.0° and in some embodiments from approximately 1.7° to approximately 2.0°. In one embodiment the taper angle β may be approximately 1.76°.

FIG. 5 depicts the gain medium 16 from FIG. 3 from an end view. In addition to sides 16c and 16d being tapered inwardly with respect to the longitudinal lasing axis L-L', one of these tapered sides may also be tilted at a slant angle α such that the side slants inwardly from the fourth side 16f to the second side 16e. In the embodiment shown in FIG. 5, first side 16c is tilted inwardly at slant angle α from fourth side 16f to second side 16e. The other sides (e.g., 16d, 16e, and 16f) are not tilted and form right angles with each other where they meet. Thus, in the embodiment shown in FIGS. 3-5, first side 16c is tapered inwardly at taper angle β and also tilted at slant angle α; third side 16d is tapered inwardly at taper angle β but not tilted; and second side 16e and fourth side 16f are neither tapered nor tilted. The polished finish of sides 16c, 16d may provide a high reflectivity internal surface for the pump light to efficiently propagate down the length (i.e., along the lasing axis L-L') of the gain medium 16. As such, the laser light in the gain medium 16 may be efficiently reflected and mixed by the polished sides without self oscillation since sides 16c, 16d may be angled (tapered and/or tilted) with respect to each other. Thus, the introduction of these two angles may improve the efficiency of the laser 10.

Referring again to FIGS. 1, 3-5, the two sides with are not tapered (e.g., second side 16e and fourth side 16f) may have a ground blasted finish which may facilitate the removal of heat from the gain medium. Also, laser light inside the gain medium 16 may be absorbed by these sides due to their ground blasted finish. The sides of the gain medium 16 which are ground blasted may be coupled to a thermally-conductive element (e.g., a heat sink, not shown) in order to remove heat energy from the gain medium 16 and the laser 10. The thermally-conductive element may comprise a thermally conductive material, such as copper or indium, and may transfer the heat away from the laser 10 and may have a thermal coefficient of expansion (TCE) nearly matching that of the gain medium 16. For example, indium may be used to thermally couple the two sides 16e, 16f of the gain medium 16 to a heat sink. Passive heat sinks may be used, which may simply transfer the heat energy to the air or to another component. Alternatively, active heat sinks may be used, such as water-cooled or gas-cooled heat sinks. Thus, it is contemplated that any suitable heat sink may be coupled to one or more sides of the gain medium 16 in order to remove heat energy therefrom. In addition, the pump light source 12 (via the spacers 12p), the mirror element 14, and the light source couplers (described hereinafter) may also be used in conjunction with the heat sinks in order to cool the laser 10. When a surface is finished by "ground blasting" (or is referred to as being "ground blasted"), it may be finished by standard grit-blasting and may facilitate the thermal coupling of the indium having the heat sink. A ground blasted finish may also facilitate the mechanical mounting of the gain medium 16 through, for example, the use of TCE-matched epoxy.

The gain medium 16 may be held in place with a plurality of mounting wedges 16h such as, for example, using three mounting wedges 16h mechanically confining the gain medium 16 in at least one direction while maintaining efficient internal reflection. The mounting wedges 16h may be designed so that mechanical integrity may be achieved by relatively small contact areas. Accordingly, these mounting wedges 16h may make a small point contact at a corner where two sides meet (as is shown in FIGS. 3-5), which may minimize any detrimental effects the wedges may have on the operation of the laser due to the fact that they are in physical contact with the polished highly-reflective sides (e.g., 16c and 16d) of the gain medium. Although three mounting wedges 16h are shown, it is anticipated that any suitable number of mounting wedges may be used. For example, six wedges may be used if the gain medium is relatively long. It is also contemplated that many other conventional and yet-to-be developed similar multi-contact point (e.g., three-point contact) mechanical pocket designs may be used.

The second end 16b of the gain medium 16 may be optically coupled to the Q-switch 18 (e.g., EO, AO, or passive Q-switch). Both the first end 16a and the second end 16b of the gain medium 16 may be polished or coated in order to efficiently transfer light. The first end 16a may have a polished finish so that the light produced by the pump light source 12 is efficiently transmitted into the gain medium 16 and/or simultaneously act as a mirror (like the minor element 14 shown in FIG. 1). Likewise, the second end 16b may also be polished such that the laser beam efficiently exits the gain medium 16. In this embodiment, two sides (e.g., 16c and 16d) of the gain medium 16 have a polished finish and are used to internally reflect the laser light; the other two sides (e.g., 16e and 16f) have a ground blasted finish are used to remove heat from the gain medium 16.

Referring again to FIGS. 1 and 2, the pump light source 12 may, for example, emit light 12a at an angle of up to 10 degrees in the transverse direction (e.g., Y-axis or transverse T-T' axis in FIG. 2) and up to 30 degrees in the longitudinal direction (e.g., Z-axis or longitudinal l-l' axis in FIG. 2). In order to improve efficiency, the end pumped laser 10 may be designed so that light 12a exiting the pump light source 12 at a relatively high angle (e.g., 30° in the longitudinal direction relative to the surface 12s) is directed toward the polished and tapered side (e.g., sides 16c, 16d in FIGS. 3-5) of the gain medium 16 so that it can be internally reflected for improved efficiency. Light 12a exiting the end pump light source at a relatively low angle (e.g., 10° in the transverse direction relative to surface 12s) may be directed toward a ground blasted side of the gain medium. Directing the light 12a exiting at a relatively high angle to a polished surface of the gain medium 16 may maximize the reflective bouncing and absorption which may occur in the direction of the lasing (e.g., parallel to the longitudinal lasing axis L-L' in FIGS. 3 and 4) and may create optical guiding of the light from the pump light source 12. This may also provide additional trapped pumping (i.e., amplification of the laser light) near the first end 16a and along the sides 16c-f of the gain medium 16. One way to accomplish the directing of the light 12a exiting the pump light source 12 as a relatively high angle (e.g., 30° in the longitudinal direction relative to the surface 12s) toward the polished and tapered sides (e.g., sides 16c, 16d in FIGS. 3-5) is by orienting, for example, the diode bars 12d in a transverse orientation as shown in FIG. 2 such that the relatively high angle light 12a (e.g., 30° in the longitudinal direction relative to the surface 12s) is directed to the polished and tapered sides 16c and 16d and the relatively low angle light 12a (e.g., 10° in the transverse direction relative to surface 12s) may be directed toward a ground blasted side of the gain medium (e.g., 16f).

Figure 6A:
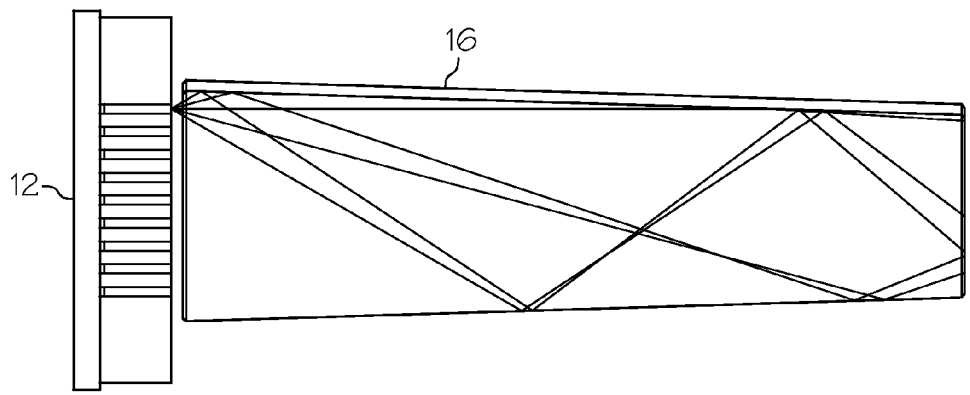
FIGS. 6A-E depict a top view of an end pumped gain medium according to one or more embodiments shown and described herein.
Figure 6B:
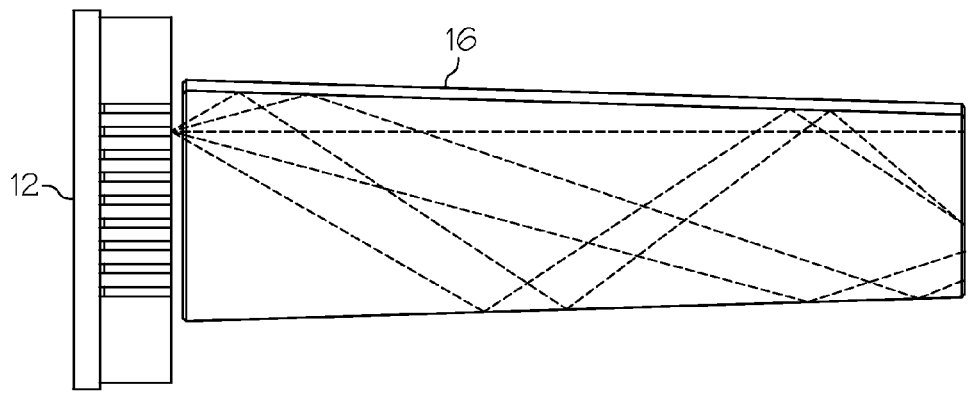
Figure 6C:
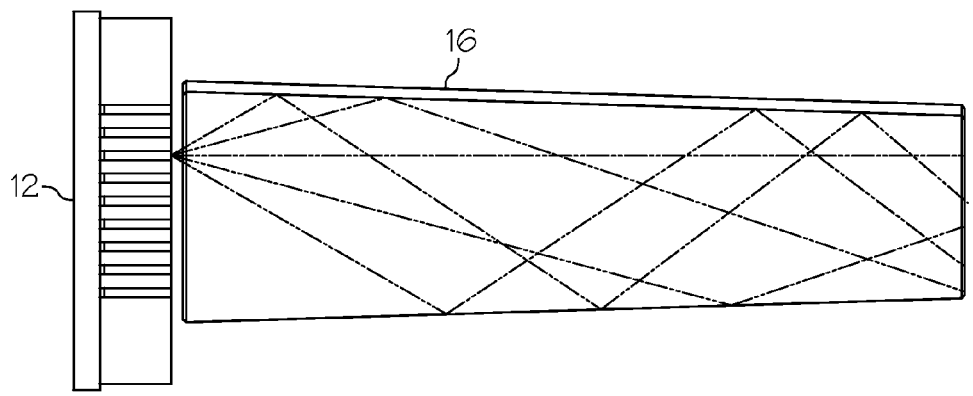
Figure 6D:
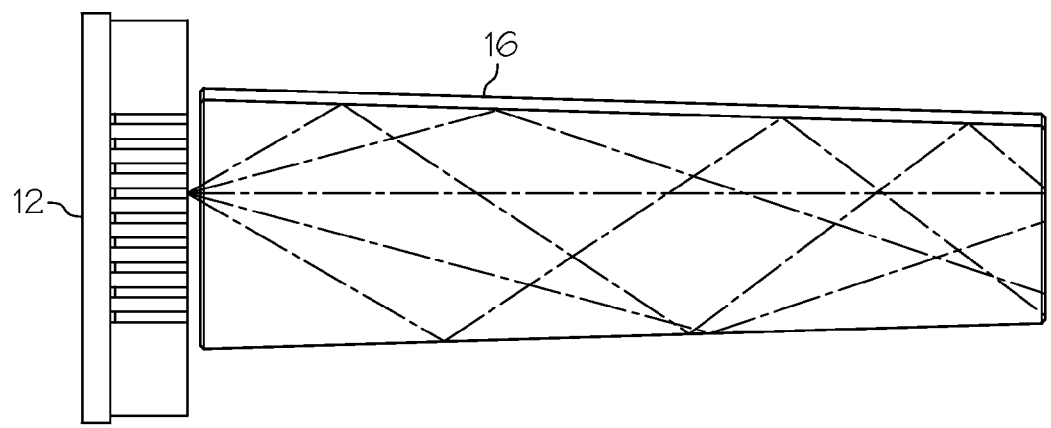
Figure 6E:
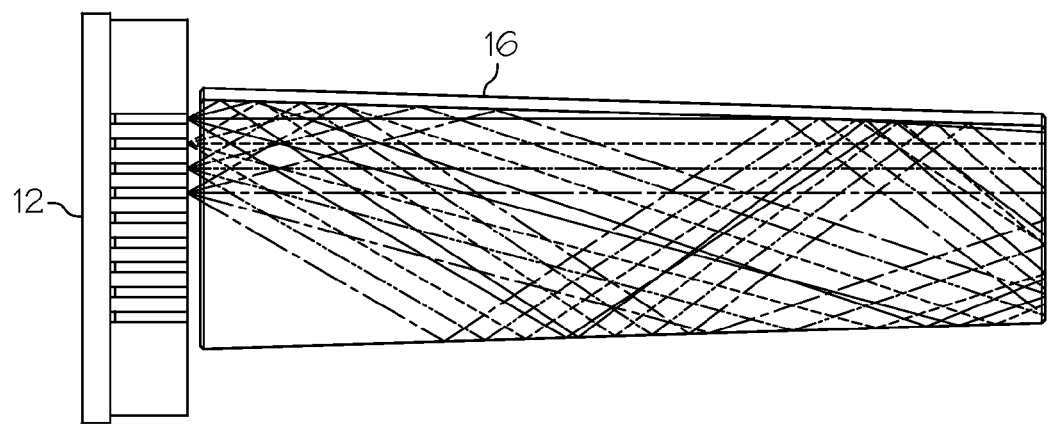

FIGS. 6A-E show an example of the end pumped gain medium 16 in which the pump light source 12 is optically coupled to the gain medium 16 so as to take advantage of the angled light emitted by the pump light source 12. For example, some of the light emitted by the individual diode bars may exit at an angle of approximately 30 degrees from the perpendicular of the surface 12s of the pump diode (e.g., see FIG. 2). In FIGS. 6A-E and for illustration purposes only, and not limitation, some of the paths taken by the light are shown for four of the diode bars which comprise the pump light source. As shown, the gain medium 16 has two sides which are tapered inwardly at taper angle β. In addition, one of the sides tapered inwardly also has a slant angle α, although this may be difficult to see because of the view. FIG. 6A shows some paths taken by light emitted by the first diode bar (from the top). FIGS. 6B-D shows some paths taken by light emitted by the second, third, and fourth diode bars, respectively. FIG. 6E shows some of the paths taken by light collectively emitted by the first through fourth diode bars. As shown in FIG. 6E, the taper angle β of the gain medium 16 causes the light to be reflected in the gain medium 16 so as to be relatively evenly distributed and to prevent internal oscillating.

Turning again to FIG. 1, the Q-switch 18 may comprise either an active or a passive Q-switch 18. For the purposes of this disclosure, references made to a Q-switch may apply to either an active or passive Q-switch. There are at least two types of active Q-switches which may be used: an EO (electro-optic) Q-switch or an AO (acousto-optic) Q-switch. The EO Q-switch may permit lower repetition rates and shorter pulse widths of the laser beam 22, while the AO Q-switch may permit higher repetition rates and longer pulse widths. Although the laser 10 depicted may operate more efficiently in QCW mode with EO Q-switches, the CW operation of the gain medium 16 may be possible by using conventional AO Q-switches or passive Q-switches. Either type of active Q-switch 18 may be actively controlled by a controller. That is the active Q-switch may be electrically coupled to the controller such that the controller is capable of directly controlling the on/off characteristics of the active Q-switch. In addition to a controller, the active Q-switches may also require relatively high voltage to operate. Thus, active Q-switches may require more space and energy and may produce relatively high levels of electromagnetic radiation as well.

The Q-switch 18 may permit the laser 10 to operate in a pulsed mode and, as such, may have two states. In one state, the Q-switch 18 may be turned off so as to block the laser beam 22 from exiting the laser, while in the other state the Q-switch 18 may be turned on so as to allow the laser beam 22 to exit the laser. In this fashion, the Q-switch 18 may allow the laser beam 22 to be pulsed. When the Q-switch 18 is turned off, the energy level of the laser light within the gain medium 16 may build or increase. Because the energy level of the laser light within the gain medium 16 may build up during the time the Q-switch 18 is switched off, the laser 10 may be able to produce bursts of the laser beam 22 having a very high peak power for a relatively short time duration. Thus, pulsed mode may allow bursts of a high-energy laser beam 22 using the same energy and producing the same or less heat as a continuous, lower-energy laser beam 22 when operating in CW (continuous wave) mode. For example, a laser with a Q-switch 18 may be able to produce energy per pulse of 12 mJ at a wavelength of 1064 nm, wherein the pulses are produced at a rate of 20 Hz, have a pulse duration of 20 ns, and may have a peak power of 600,000 kilowatts and an average power of 240 milliwatts. The same laser, if suitably cooled and pulsed at 1000 Hz, may be capable of producing 12 W of average power.

Since some of the power of the pump light source 12 may not be efficiently absorbed by the gain medium 16, optically coupling the passive Q-switch 18 at the second end 16b of the gain medium 16 may allow the passive Q-switch 18 to efficiently switch, and a higher concentration of passive Q-switch materials may be used. This may minimize the jitter introduced by the passive Q-switch 18. In addition, the gain medium's physical size (e.g., the size of the input end (e.g., first end 16a) and the size of the output end (e.g., second end 16b) and doping concentration may control the light absorption characteristics of the gain medium 16 and may be designed to optimize the operation of the passive Q-switch 18.

A passive Q-switch may permit the laser to operate with both high and low repetition rates. Operation of the passive Q-switch may be controlled indirectly by the amount of light energy introduced into the passive Q-switch by, for example, the pump light source. Consequently, the operation of the passive Q-switch may depend on the type of pump light source used as well as the characteristics of the gain medium 16. In one embodiment, one or more of the diode bars 12d in the pump light source 12 may emit light at a wavelength which may be absorbed by the passive Q-switch. For example, as set forth above, one type of passive Q-switch may absorb light having a wavelength of 940 nm. Diode bars emitting multiple wavelengths of light may be used in order to create a wider temperature range of operation with minimal thermal management devices (e.g., heat sinks) as well as to create efficient laser 10 operation with the passive Q-switch. The passive Q-switch 18 may use also leakage from the gain medium 16 for controlling the energy level inside the gain medium 16 and to provide controlled pulsing of the laser beam 22. Thus, the amount of energy applied to the pump diode source (i.e., the amount of light energy entering the gain medium and/or passive Q-switch) may determine the operation of the Q-switch 18. Typically, operation of a passive Q-switch may only be indirectly controlled by an end pump light source.

Very high peak powers may be attained from lasers using an AO Q-switch, an EO Q-switch, or a passive Q-switch. In one embodiment, a miniaturized and light weight (9.0 gram) EO Q-switch network driver subassembly may be used to control the active Q-switch such as, for example, a compact, efficient (12 V, 0.040 A, and about 0.5 W), light weight (5.4 grams) EO Q-switch driver board. In this one embodiment, the EO Q-switch network driver board may have a length of about 48.3 mm, a width of about 22.4 mm, and an overall height of about 12.8 mm, and the EO Q-switched network driver subassembly may have a length of about 34.6 mm, a width of about 19.1 mm, and an overall height of about 12.2 mm. This network driver may produce desirable oscillator module performance with 0.35 mJ (or 7 W at a 20 Hz pulse rate). Even with the reduced efficiency from normal mode to EO Q-switch mode (due to many optical component surfaces), an output of 30 mJ with a maximum of 25 Watts of input power is possible. This efficiency loss may be somewhat compensated if the system can be made to work using an optically enhanced (low jitter) or excited passive Q-switch subassembly.

The output coupler 20 may be used to facilitate the operation of the laser 10. The output coupler 20 may be operable to reflect some laser light in the gain medium 16 back into the gain medium 16 while permitting some laser light to exit the laser 10 (e.g., the laser beam 22). Thus, at least a portion of the surface of the output coupler 20 may have an HR coating which reflects the laser light inside the gain medium 16. As such, the output coupler may be considered as being partially reflective (PR). The optimum amount of reflectivity may vary from 0% to 100% and is typically determined empirically when the laser 10 is being developed. The amount of reflectivity may depend on the power level of the laser 10 and the characteristics (e.g., efficiency) of the gain medium 16. As such, the amount of reflectivity of the output coupler 20 may be optimized to produce a laser beam 22 having a maximum power level. For example, an output coupler having a reflectivity of 80% may be used for the laser 10. That is, the output coupler may reflect 80% of the laser light inside the gain medium 16 and allow 20% to escape the gain medium 16 in the form of the laser beam 22. Furthermore, the output coupler 20 may be either flat or curved so as to suitably focus the laser beam 22, if desired.

With regard to efficiency and not to be limited by theory, the laser 10 may operate at a relatively high optical-to-optical efficiency with a relatively uniform distribution of pumping (i.e., amplification) in the gain medium 16 so as to produce fast (e.g., 15 ns) pulses of the laser beam 22 with a relatively short (e.g., approximately 12 mm in length) gain medium 16. For example, if a pump light source 12 is used which emits light at three different wavelengths, typically only one of the wavelengths may actually cause lasing in the gain medium at any one moment in time. In this example, the optical-to-optical efficiency may be approximately 10% since only energy from one third of the diode bars is causing lasing. This example may be equivalent to a 30% optical-to-optical efficiency if the light emitted by all (and not just one third) of the diode bars of the pump light source were to cause lasing. An advantage of this type of system is that no temperature control of the pump light source may be necessary. In contrast, systems with pump diodes that only emit one wavelength of light may require temperature control in order to keep the pump light source at a relatively constant temperature so that the temperature coefficient of the pump diodes do not cause the emitted wavelength of light to vary as the ambient temperature varies. If temperature control is required, it may lower the overall efficiency of the laser since energy is required to heat or cool the pump light source.

Not to be limited by theory, the pump light sources (e.g., higher average power diode modules) shown and described herein may allow high pump concentration or excitation in the Nd:YAG gain medium with improved broadband wavelength pumping conversion efficiencies. Because of the efficiency improvements, a thermal management system may require only heating. This may be accomplished by connecting self-heating resistance heaters or TEC devices (e.g., thermo-electric cooling devices) to the oscillator module (e.g., connected to a top surface of the oscillator module) to bring the laser system to the operational temperature range during the start up period. Due to the low mass of both the oscillator module and amplifier module, each may use 10 Watts of electrical heater power (i.e., total of 20 Watts from a 25-Watt laser power source), and both modules may be preheated up to 40° C. temperature differential within 30 seconds. This may eliminate the need for TEC-regulated inefficient conventional thermal management hardware and control systems. If the application requires cooling and heating simultaneously, multiple TEC devices may be used to pre-cool and heat both the oscillator module and amplifier modules. Regardless of the thermal management system, waste heat may be conductively dissipated (e.g., using no fins or fans).

Again, not to be limited by theory, distributed, efficient, direct end diode pumping of the gain medium 16 (via the pump light source 12, as described in the above exemplary embodiments) may result in a much lower gain per unit area of the gain medium 16, thus allowing the laser 10 to produce pulses of the laser beam 22 having a longer time duration (e.g., when operating in QCW mode). This may cause a larger portion of the gain medium 16 to be used for amplification, resulting in a more efficient laser 10 and, consequently, a higher output power level for the laser beam 22. This distributed direct end pumping may also allow a higher number of reflections of the laser light in the gain medium 16 while optimizing uniformity, mixing different wavelengths at high pulse rates, and minimizing the possibility of damage to the gain medium 16 due to, for example, overheating. Thus one may design a relatively short (e.g., approximately 12 mm) gain medium in order to produce laser beam pulses of short duration (e.g., 1 to 10 ns) at very high peak powers with much higher efficiency.

Figure 7:
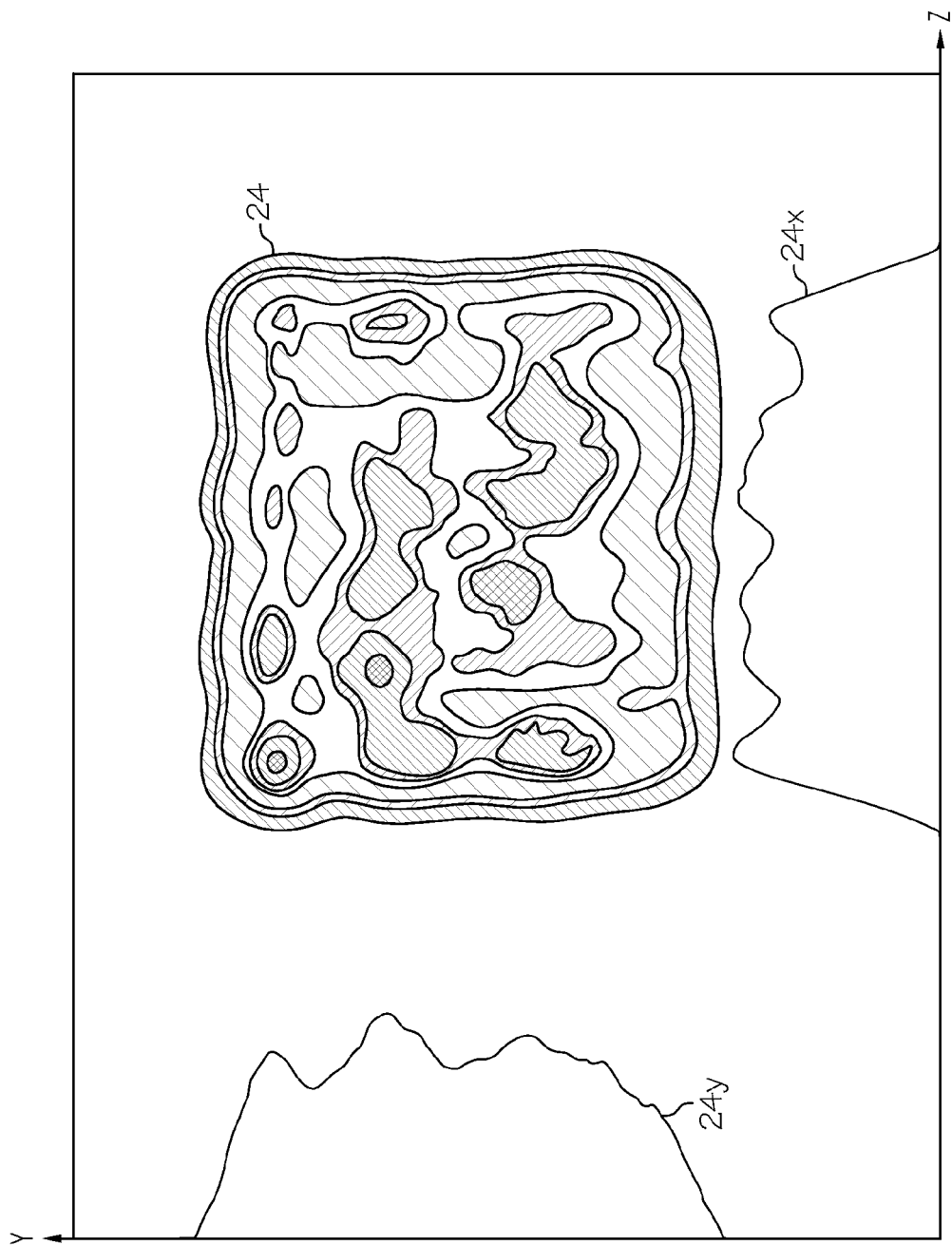
FIG. 7 depicts a cross section of a representative laser beam showing the power level produced by an end pumped laser according to one or more embodiments shown and described herein.

FIG. 7 depicts a cross section of a laser beam 24 showing the power level produced by an end pumped laser such as the one shown in FIG. 1. The shape of the laser beam 24 is nearly square and the power level is relatively uniform over the cross section of entire laser beam 24. Graph 24$x$ shows the average power level of the laser beam 24 in the X-axis, while graph 24$y$ shows the average power level of the laser beam 24 in the Y-axis. As shown in FIG. 7, the average power is relatively uniform in both the X-axis and the Y-axis across the laser beam so as to have a relatively flat top, unlike conventional lasers which may have a Gaussian distribution. This uniformity indicates a high-quality laser beam and is the result of the features shown in FIGS. 1-6 and described herein.

It is contemplated that other versions of the scalable laser may be produced, including a version of the miniature oscillator module which may generate output energy of 15 mJ having pulse width of 16-18 ns FWHM. The 15 mJ output of the oscillator module may be coupled to a single pass amplifier module having a weight of 21.4 grams. The amplifier module may feature two pump diodes (each identical to the pump diode used on the oscillator module) on the opposite sides of a Nd:YAG gain medium so as to generate a very uniform and high gain laser beam in the same direction as the oscillator's beam (e.g., generating a scalable amplified output of 30 mJ), such as the laser beam shown in FIG. 7.

Figure 8:
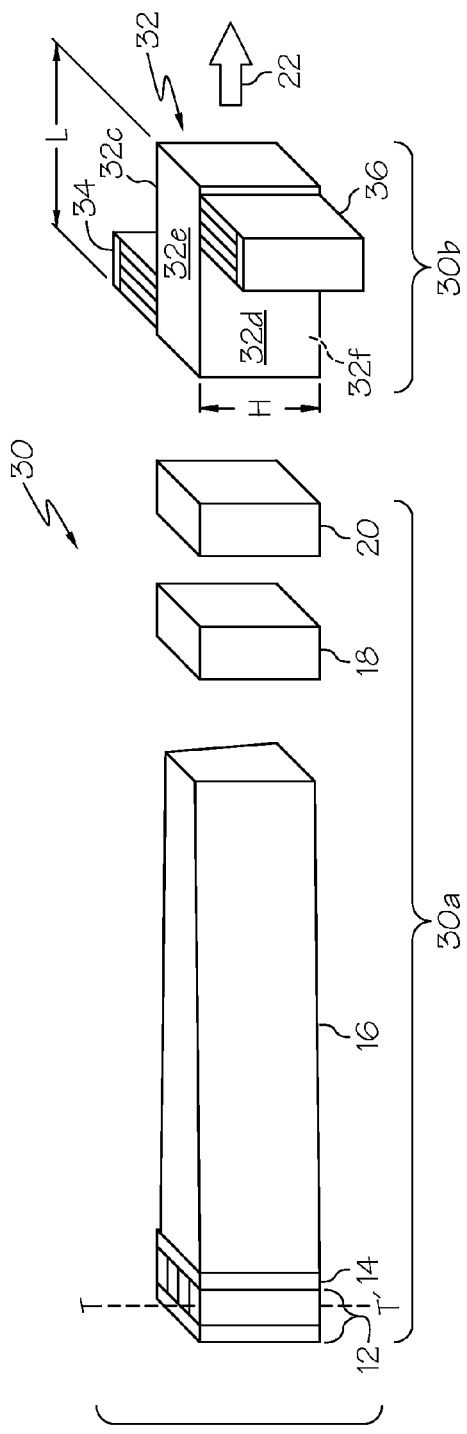
FIG. 8 depicts a perspective view of a scalable end pumped laser according to one or more embodiments shown and described herein.

FIG. 8 illustrates an embodiment of a scalable laser 30 in which the output power of the scalable laser 30 may be increased by adding one or more amplifier modules. The scalable laser 30 may comprise a pump head module 30$a$ (also called an oscillator module) and one or more amplifier modules 30$b$ (although only one amplifier module 30$b$ is shown). The pump head module 30$a$ may comprise a pump light source 12, a minor element 14, a gain medium 16, a Q-switch, and an optical coupler 20 such as embodiments shown and described above herein with reference to FIGS. 1 and 3-5. The pump head module 30$a$ may be end pumped and may produce a laser beam as also previously discussed regarding FIGS. 1 and 3-5. The scalable laser 30 may also have at least one amplifier module 30$b$ which may be optically coupled to the pump head module 30$a$ so as to further increase the power level of the laser beam 22. The amplifier module 30$b$ may comprise a second gain medium 32, and two side pump light sources 34, 36. The second gain medium 32 may be substantially rectangular (i.e., having no taper angle or slant angle) and may have a ground blasted finish except in the area where the side pump light sources 34, 36 are optically coupled to the second gain medium 32. Any suitable number of amplifier modules 30$b$ may be added in order to increase the power level of the laser beam 22 to the desired level. The side pump light sources 34, 36 may comprise transverse diode bars which emit light at one or more wavelengths, as discussed herein.

Referring still to FIG. 8, the height H of the side pump light sources 34, 36 may be designed to substantially match that of the second gain medium 32. In addition, the length of the side pump light sources 34, 36 may be one half or less than the length L of the second gain medium 32. This may permit the side pump light sources 34, 36 to be disposed on opposing sides of the gain medium and facilitate the longitudinal/lasing direction uniformity. In addition, the side pump light sources 34, 36 may be staggered so that none of the light sources face each other directly. Not to be limited by theory, this type of arrangement may improve the efficiency of the amplifier module since the pump light may be evenly distributed in the second gain medium 32. Furthermore, the size of the second gain medium 32 and associated side pump light sources 34, 36 may be designed to be relatively small (e.g., having a height H of 3 mm) to relatively large (e.g., having a height H of 12 mm or larger) so that the laser is scalable. Heat may be extracted from the remaining sides or a portion of sides of the gain medium 16 which are not optically coupled to a side pump light sources 34, 36. If two or more amplifier modules 30b are added to a pump head module 30a, the amplifier modules may be rotated 90° with respect to each other. For example, one amplifier module may have the side pump light sources 34, 36 optically coupled to sides 32c and 32d as shown in FIG. 8, while a second amplifier module may have the side pump light sources 34, 36 on the other two sides 32e and 32f of the second gain medium 32. This may permit even amplification when two or more amplifier modules are used. This rotational orientation of the side pump light sources 34 and 36 relative to the gain medium for each additional amplifier module may be repeated as desired.

In another embodiment, FIG. 9 shows a perspective view of a side pumped laser 40. The side pumped laser 40 may include an end mirror 41, a gain medium 46, two side pump light sources 42, 44, a Q-switch 48, and an output coupler 50. The side pumped laser 40 may be operable to produce a laser beam 52. The end mirror 41 may be optically coupled to the gain medium 46 such that it reflects most or all of the laser light inside the gain medium 46 (e.g., 99.9% reflectivity). Alternatively, the end of the gain medium 16 to which the end minor 41 is coupled may be designed to embody the optical characteristics of the end mirror 41 so that a discrete component may not be necessary. The side pump light sources 42, 44, Q-switch 48, and output coupler 50 may comprise the same devices, configuration, design and function as previously described herein. Such description above is herein incorporated by reference in its entirety. For example, the two side pump light sources 42, 44 may comprise transverse diode bars capable of emitting light at one or more wavelengths as shown in FIG. 2 and described above herein.

Figure 12:
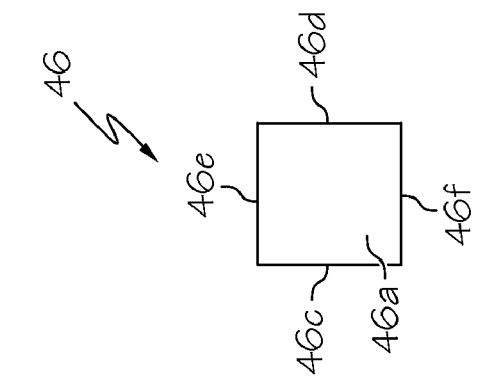
FIG. 12 depicts an end view of the gain medium of FIG. 10.
Figure 11:
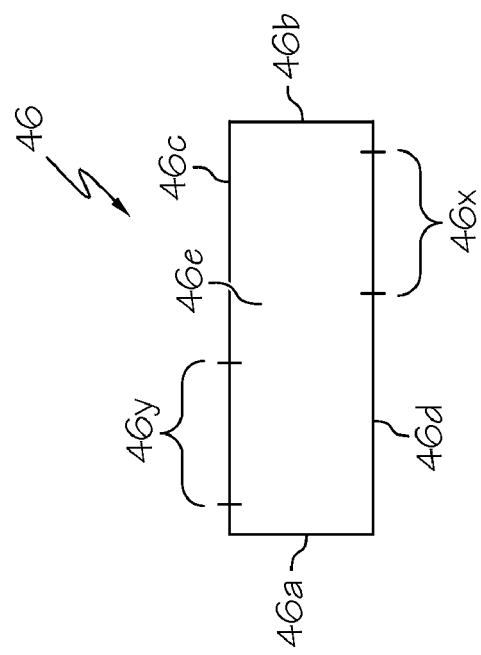
FIG. 11 depicts a top view of the gain medium of FIG. 10.
Figure 10:
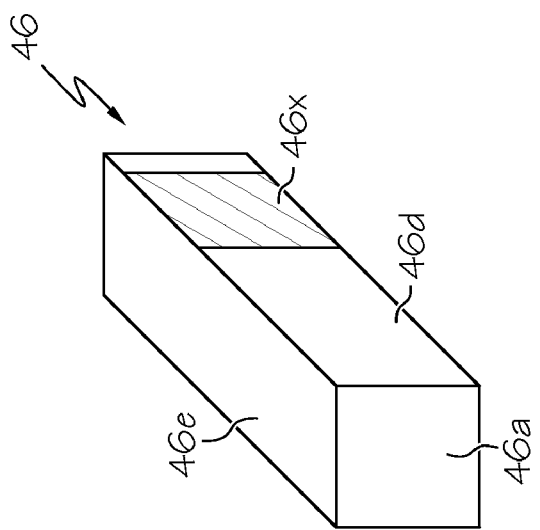
FIG. 10 depicts a perspective view of a gain medium operable for use with a side pump light source according to one or more embodiments shown and described herein.

FIGS. 10-12 depict several views of the gain medium 46 for the side pumped laser of FIG. 9. The gain medium 46 may comprise a first end 46a, a second end 46b, and four sides including a first side 46c, a second side 46e, a third side 46d, and a fourth side 46f. The ends and the sides may all be substantially perpendicular to each other so as to form a rectangular solid. The first side 46c and the third side 46d may oppose each other, while the second side 46e and the fourth side 46f may oppose each other. The first side 46c may have a first aperture area 46y which is capable of optically coupling to one of the two side pump light sources (e.g., side pump light source 42). Likewise, the third side 46d may have a second aperture area 46x which is capable of optically coupling the other of the two side pump light sources (e.g., side pump light source 44). The first aperture area 46y and the second aperture area 46x may be polished to as to facilitate the optical coupling of the gain medium 46 to the two side pump light sources 42, 44. The remainder of the first side 46c and the remainder of the third side 46d may have a ground blasted finish (i.e. in any portion of the side other than the aperture areas). Likewise the entire second side 46e and the entire fourth side 46f may be ground blasted in order to, for example, remove heat from the gain medium 46. The first end 46a may be polished so that it can be optically coupled to the end mirror 41. Likewise the second end 46b may be polished so that it may be optically coupled to a Q-switch 48 or other suitable device.

FIG. 13A shows a top view of the side pumped later 40 of FIGS. 9-12 (with the Q-switch removed for clarity). The two side pump light sources 42, 44 are on opposed sides of the gain medium 46. This figure depicts some of the paths taken by the light emitted by the side pump light sources 42, 44. The light emitted by the side pump light sources 42, 44 may be substantially perpendicular to the surface of the respective light sources. However, some of the light may exit at an exit angle γ, which may be, for example, approximately 30° from the perpendicular in some embodiments (as discussed with respect to FIG. 2). In order to take advantage of this characteristic, the side pump light sources 42, 44 may be disposed on the respective sides (46c, 46d) of the gain medium 46 such that emitted light which is not perpendicular to the side (and exits the side pump light sources 42, 44 at angle γ) may enter the gain medium 46 and be uniformly distributed in the gain medium 46. As such, the side pump light sources 42, 44 may be disposed on their respective sides, based on the exit angle γ and the width of the gain medium 46 in order to stagger the light of the two side pump light sources 42, 44, as shown in FIG. 13A. Not to be limited by theory, this design may increase the efficiency of the laser and produce a more uniform laser beam 52. Other similar embodiments are contemplated by employing one or more side light sources having any suitable length that is equal to or shorter than one half the length of the gain medium 46. It is also understood that exit angle γ may comprise other angles as well. FIG. 13B shows an end view of the gain medium 46 and the side pump light sources 42, 44.

The staggered arrangement of the side pump light sources 42, 44 may permit relatively uniform pumping over a cross section of the gain medium 46, thus producing a high-quality laser beam. The first side pump light source 42 and the second side pump light source 44 may emit pump light into the gain medium so that the pump light emitted by each travels from one side of the gain medium to the other side of the gain medium, as shown in FIG. 13A. As the travels from one side of the gain medium 46 to the other, its intensity may decrease significantly due to the absorption of the pump light by the gain medium 46. Consequently, the intensity of the pump light emitted by first side pump light source 42 and the second side pump light source 44 may decrease in an approximately linear fashion. The combined and staggered side pumping may cause the laser beam inside the gain medium 46 may be subject to relatively uniform amplification along the length of the gain medium 46 (e.g., due to the combined light intensity of both side pump light sources 42, 44). This characteristic may be present whether the side pump light sources comprise diode bars emitting light at one wavelength or multiple wavelengths. In one embodiment, the diode bars of the side pump light sources 42, 44 are in a transverse orientation so as to uniformly emit pump light across the gain medium 46. Thus, the staggered arrangement of the two side pump light sources 42, 44 may permit substantially uniform amplification of a laser beam across a cross section of the laser beam (e.g., as shown in FIG. 7). FIG. 13B depicts a portion of the light emitted by the two side pump light sources 42, 44 from and end view. As discussed, most light emitted by the side pump light sources 42, 44 may be substantially perpendicular to the surface of the respective light sources. However, some of the light may exit at an angle which may be, for example, approximately 10° in the transverse direction in some embodiments (as discussed with respect to FIG. 2). Light exiting the side pump light sources 42, 44 at an angle in the direction of the transverse axis may be directed toward sides of the gain medium 46 which may have a ground blasted finish (e.g., sides 46e and 46f).

Figure 14:
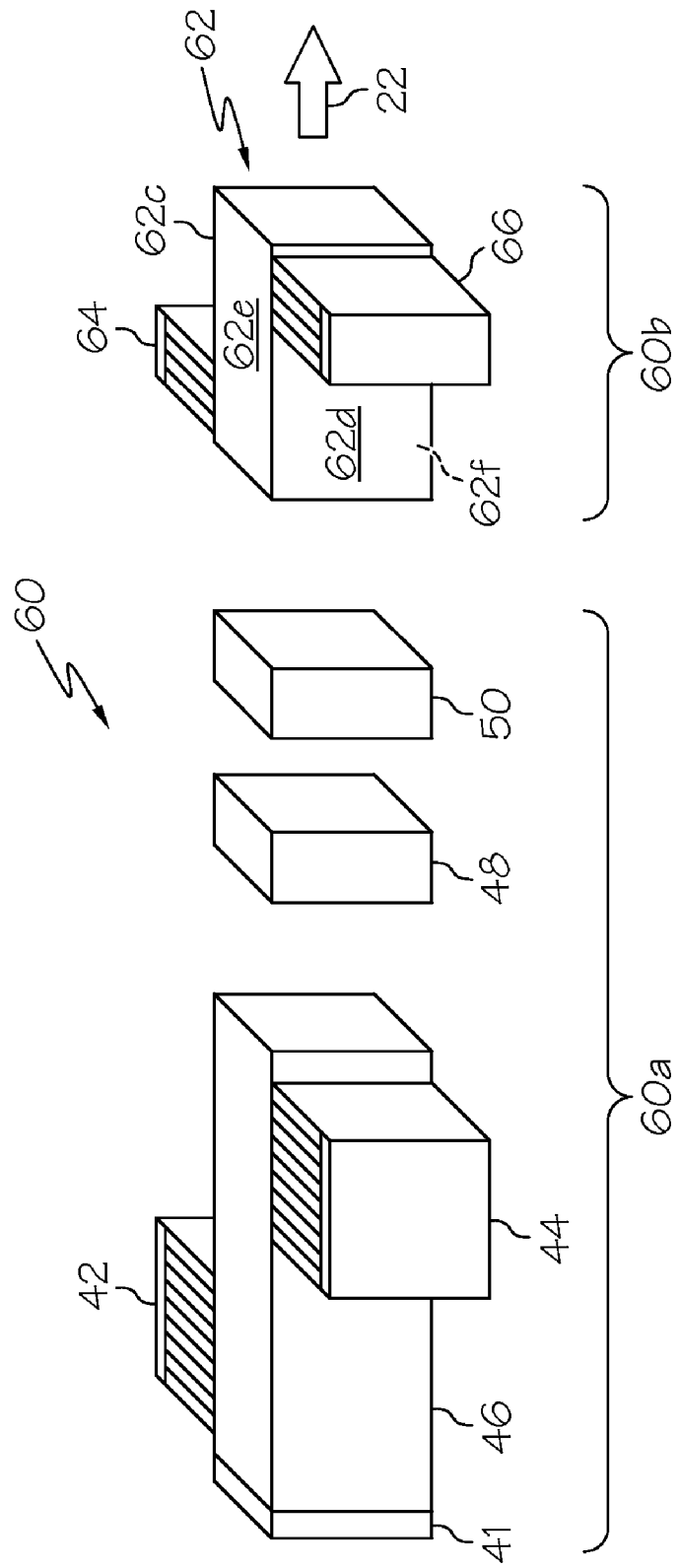
FIG. 14 depicts a perspective view of a scalable side pumped laser according to one or more embodiments shown and described herein.

FIG. 14 depicts another embodiment of a scalable laser 60. The scalable laser 60 may include a pump head module 60a and one or more amplifier modules 60b (only one amplifier module 60b is shown). The pump head module 60a may comprise an end mirror 41, a gain medium 46, two side pump light sources 42, 44, a Q-switch 48, and an output coupler 50. The components and function of the pump head module 60a may function as described above herein, particularly with regard to FIGS. 9-13. The one or more amplifier modules 60b may each comprise a second gain medium 62 and two additional side pump light sources 64, 66. The amplifier module 60b may be optically coupled to the pump head module 60a in order to provide additional amplification of the laser beam 52 (thus increasing its power). It is contemplated that any number of additional amplifiers modules 60b may be added to the scalable laser 60 in order to increase the power output capability of the scalable laser 60, and each amplifier module 60b may use the advantages depicted in any and all embodiments shown and described herein such as those shown in FIGS. 9-12 to create the scalable, efficient lasers. The amplifier module 60b may function as the amplifier module of FIG. 8 as described herein. If two or more amplifier modules 60b are added to a pump head module 60a, the amplifier modules may be rotated 90° with respect to each other. For example, one amplifier module may have the side pump light sources 64, 66 optically coupled to sides 62c and 62d as shown in FIG. 14, while a second amplifier module may have the side pump light sources 64, 66 on the other two sides 62e and 62f of the second gain medium 62. This may permit even amplification when two or more amplifier modules are used. This rotational orientation of the side pump light sources 64 and 66 relative to the gain medium for each additional amplifier module may be repeated as desired.

Figure 15:
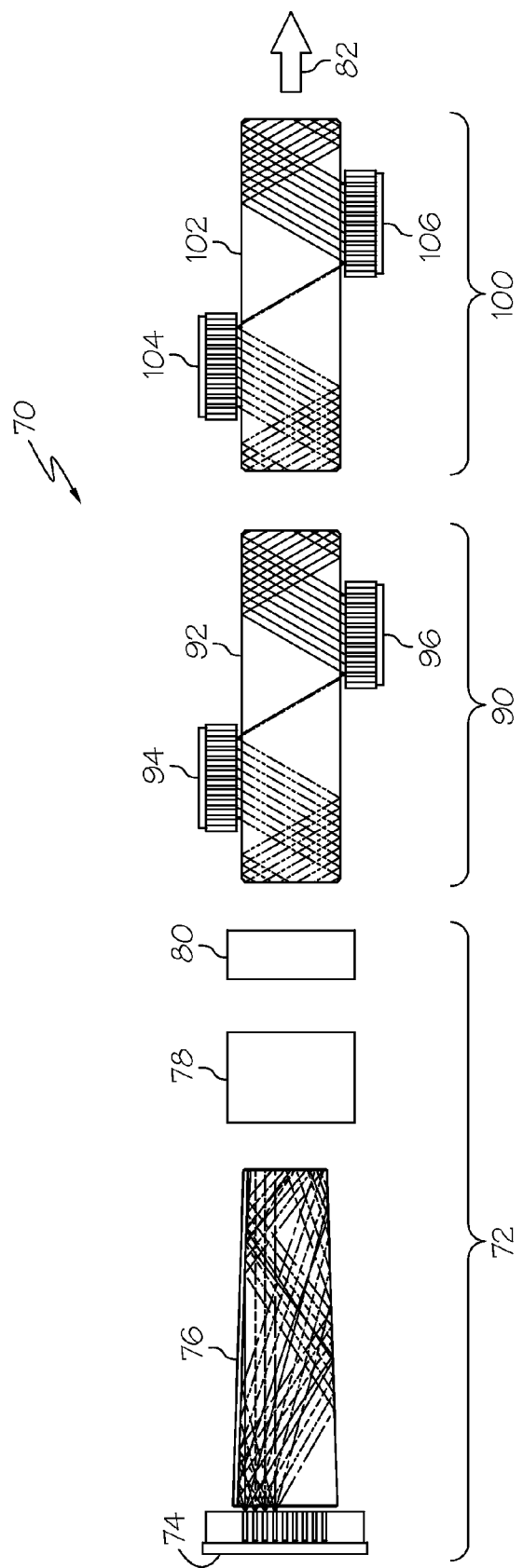
FIG. 15 depicts a top view of a scalable end pumped laser according to one or more embodiments shown and described herein.

FIG. 15 illustrates another embodiment of an efficient, scalable laser 70. The laser may include a pump head module 72, a first amplifier module 90, and a second amplifier module 100. The pump head module 72 may comprise an end pumped laser having an end pump light source 74, a gain medium 76, a Q-switch 78, and an optical coupler 80. The end pump light source 74 may comprise one or more diode bars capable of emitting one or more wavelengths, as described herein. The gain medium 76 may include two sides which are tapered inwardly at a taper angle β, one side of which may also be tilted at a slant angle α, as described herein with respect to FIGS. 3-5. The Q-switch 78 and optical coupler 80 may also function as previously described herein. Each amplifier module 90, 100 may each comprise a second gain medium 92, 102 and two side pump light sources 94, 96 and 104, 106. The amplifier modules 90, 100 may operate as previously described herein. The scalable laser 70 may be capable of producing a laser beam 82. Adding more amplifier modules may increase the energy and/or power level of the laser beam 82, thus making the scalable laser 70 scalable.

Figure 16:
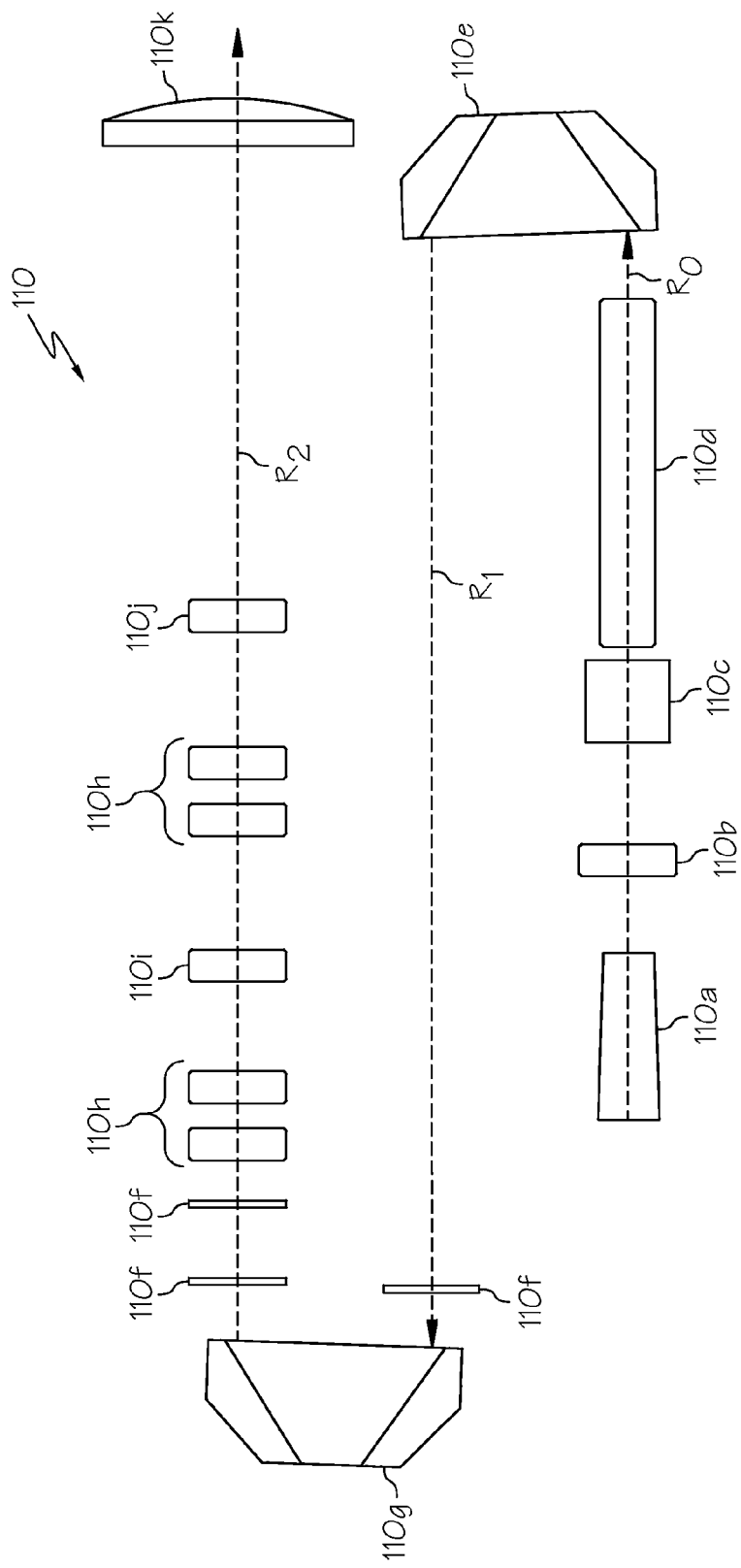
FIG. 16 depicts a schematic representation of a miniaturized, folded, end pumped, scalable laser according to one or more embodiments shown and described herein.

FIG. 16 depicts a schematic representation of a miniaturized, folded, end pumped laser system 110. Instead of optically aligning all of the components in a straight line, the laser system 110 of FIG. 16 "folds" the laser beam by using one or more corner cubes 110e, 110g. The laser system 110 may include a gain medium 110a, a lens 110b, a polarizer 110c, and a Q-switch 110d. These components may be optically coupled to each other so as to produce a laser beam as described herein. The laser beam $R_0$ may be directed to a corner cube 110e, where the laser beam is folded so as to be reflected backwards, producing reflected laser beam $R_1$. The reflected $R_1$ laser beam is directed to another corner cube 110g which may reflect this laser beam backwards again, producing reflected laser beam $R_2$. This reflected laser beam $R_2$ may travel in a direction nearly the same as the original beam $R_0$. The laser system 110 may include one or more compensation waveplates 60f in order to compensate the laser beam due to the presence of the corner cubes 110e, 100g. The laser system 110 may also comprise one or more Risley pairs 110h, an output coupler 110i, and one or more lenses 110j, 110k. The laser beam produced by the laser system 110 may have substantially the same characteristics if all the optical components were aligned in a straight line. However, the corner cubes 110e, 110g permit a more compact end pumped laser system 110 due to the multi-angular and multi-directional folding action. In the embodiment shown, the length of the laser system 110 may be approximately 4 inches. This laser may comprise end pump light sources and/or side pump light sources optically coupled to the gain medium 110a and/or one or more additional gain media as described above herein.

FIG. 17 depicts another schematic representation of a miniaturized, folded, end pumped, scalable laser system 120. Instead of optically aligning all of the components in a straight line, the laser system 120 of FIG. 17 "folds" the laser beam by using one or more corner cubes 120e, 120h, 120j, 120l. The laser system 120 may include components as previously described herein, including a pump head module comprising a gain medium 120a, one or more lenses 120b, a polarizer 120c and a Q-switch 120d (e.g., a pump head module). The laser system 120 may further comprise one or more amplifier modules 120k, which may permit the laser system 120 to be scaled as described herein. The laser system 120 may also include other components such as compensation waveplates 120f, Risley pairs 120g, and an output coupler 120i. The laser beam produced by the laser system 120 may have substantially the same characteristics if all the optical components were aligned in a straight line. However, the corner cubes 120e, 120h, 120j, 120l permit a more compact scalable laser system 120 due to the multi-angular and multi-directional folding action. In the embodiment shown, the overall length of the laser system 120 may be approximately 1.4 meters, while each fold length may be as short as 50 mm. The laser beam $R_0$ produced by the pump head module (e.g., gain medium 120a, lens 120b, polarizer 120c, and Q-switch 120d) may be reflected by corner cube 120e, producing reflected laser beam $R_1$. Reflected laser beam $R_1$ may be reflected by corner cube 120h, producing reflected laser beam $R_2$. Reflected laser beam $R_2$ may be reflected by corner cube 120j, producing reflected laser beam $R_3$. And reflected laser beam $R_3$ may be reflected by corner cube 120l, producing reflected laser beam $R_4$. Optical components may be inserted in any of these reflected laser beams (or folds) such as, for example, an amplifier 120k inserted in reflected laser beam $R_3$. This laser may comprise end pump light sources and/or side pump light sources optically coupled to the gain medium 110a and/or one or more additional gain media as described above herein.

Figure 18A:
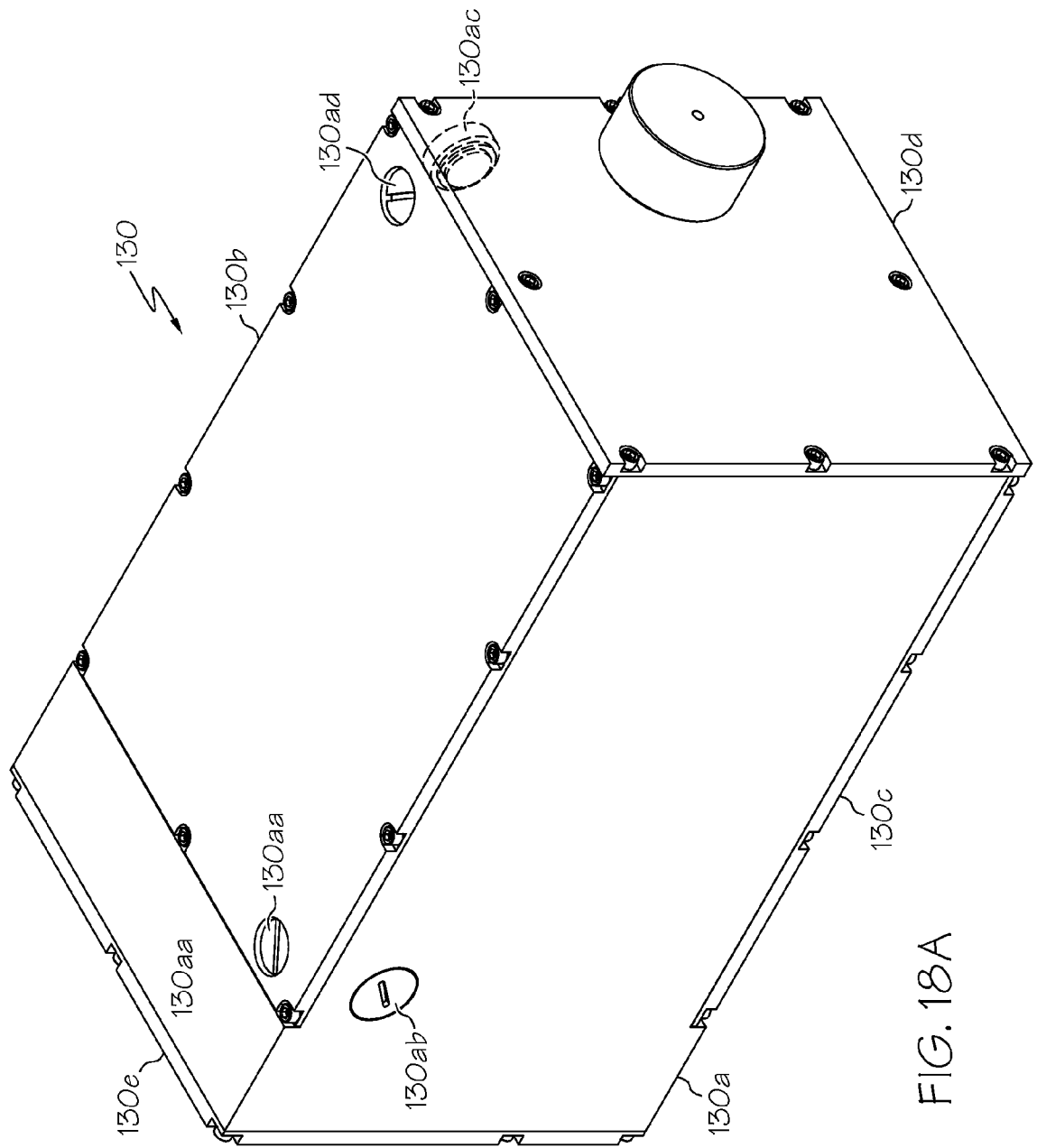
FIGS. 18A-C depict a laser having a uni-body housing according to one or more embodiments shown and described herein.
Figure 18B:
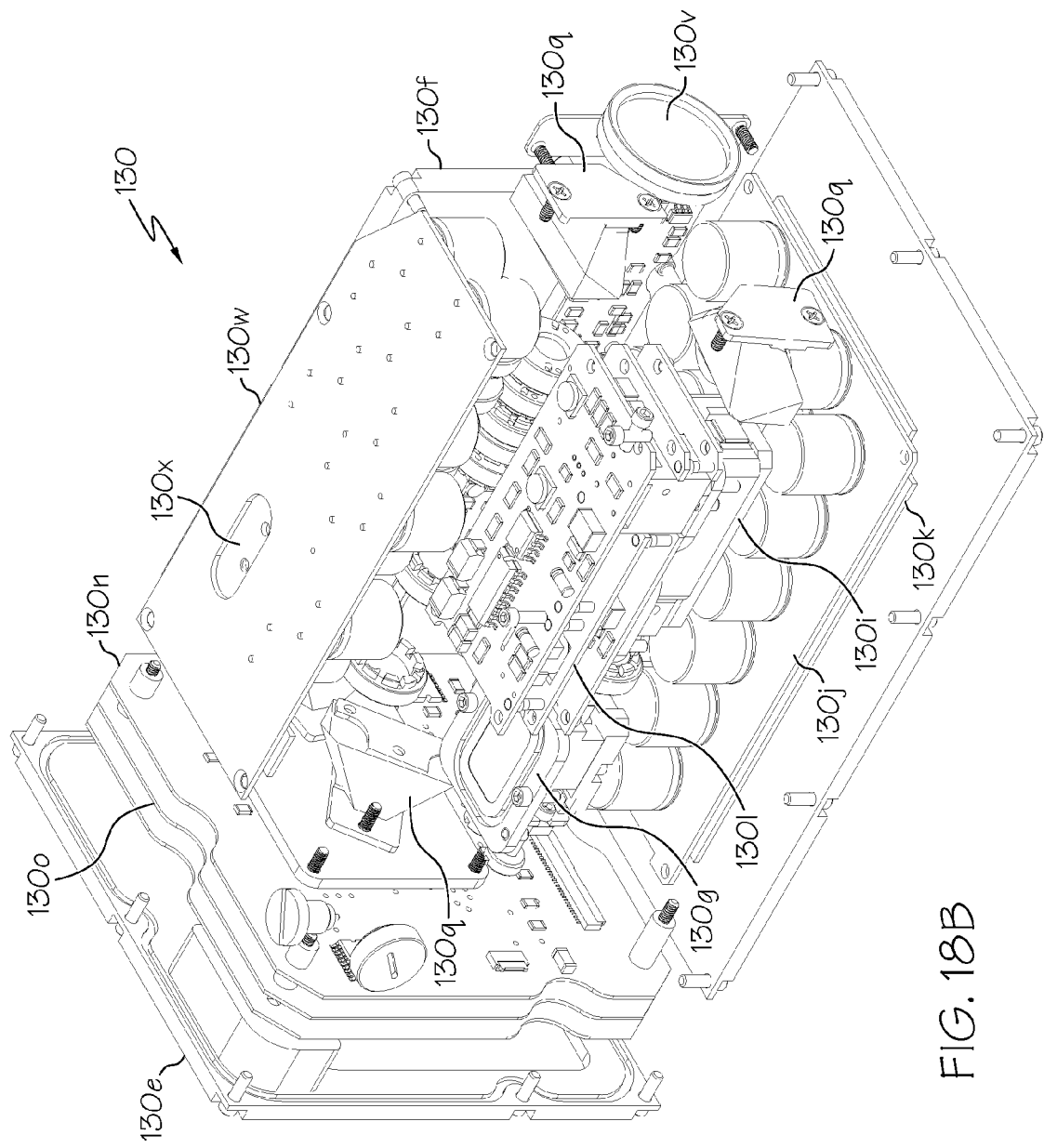
Figure 18C:
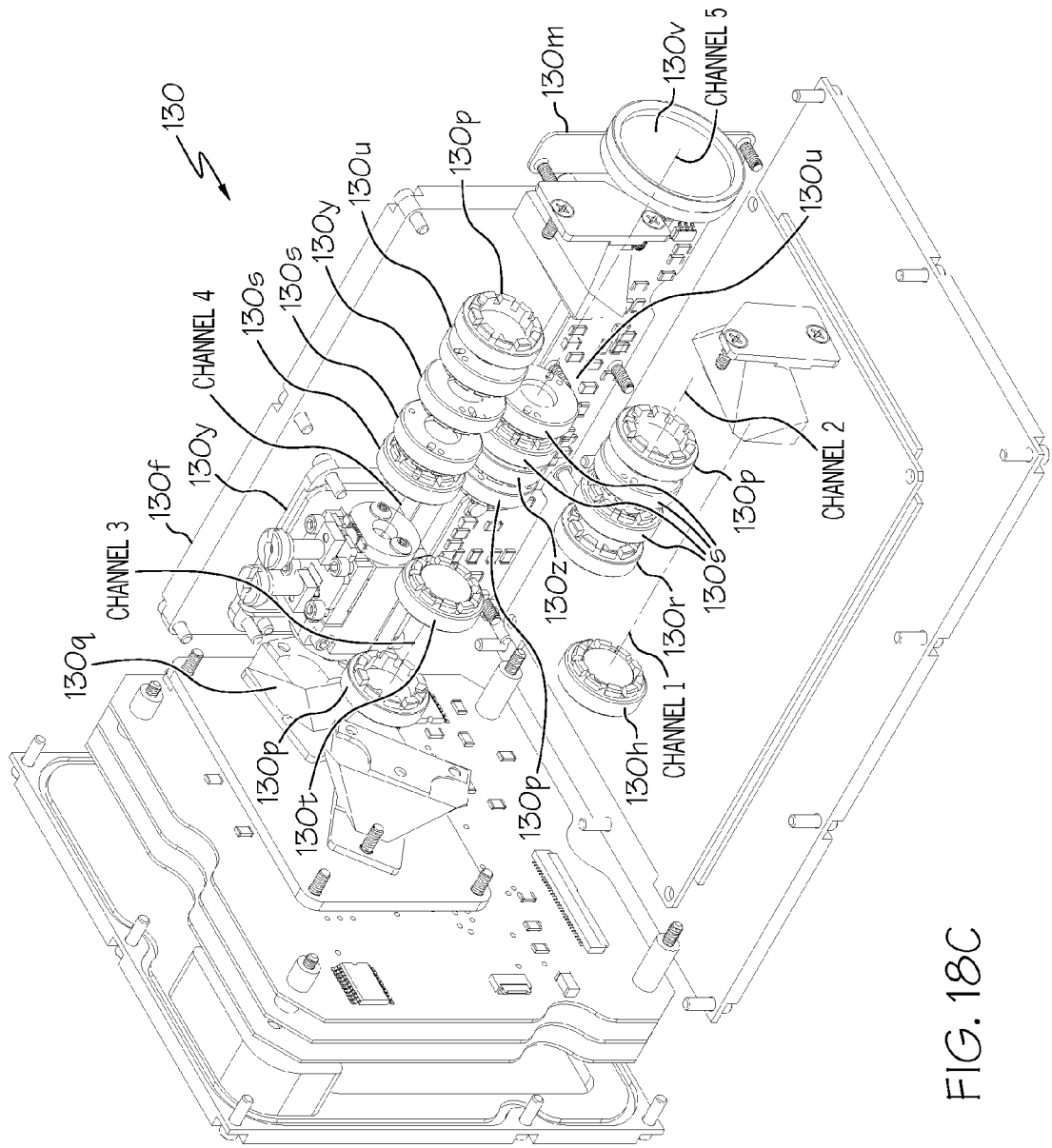
Figure 19A:
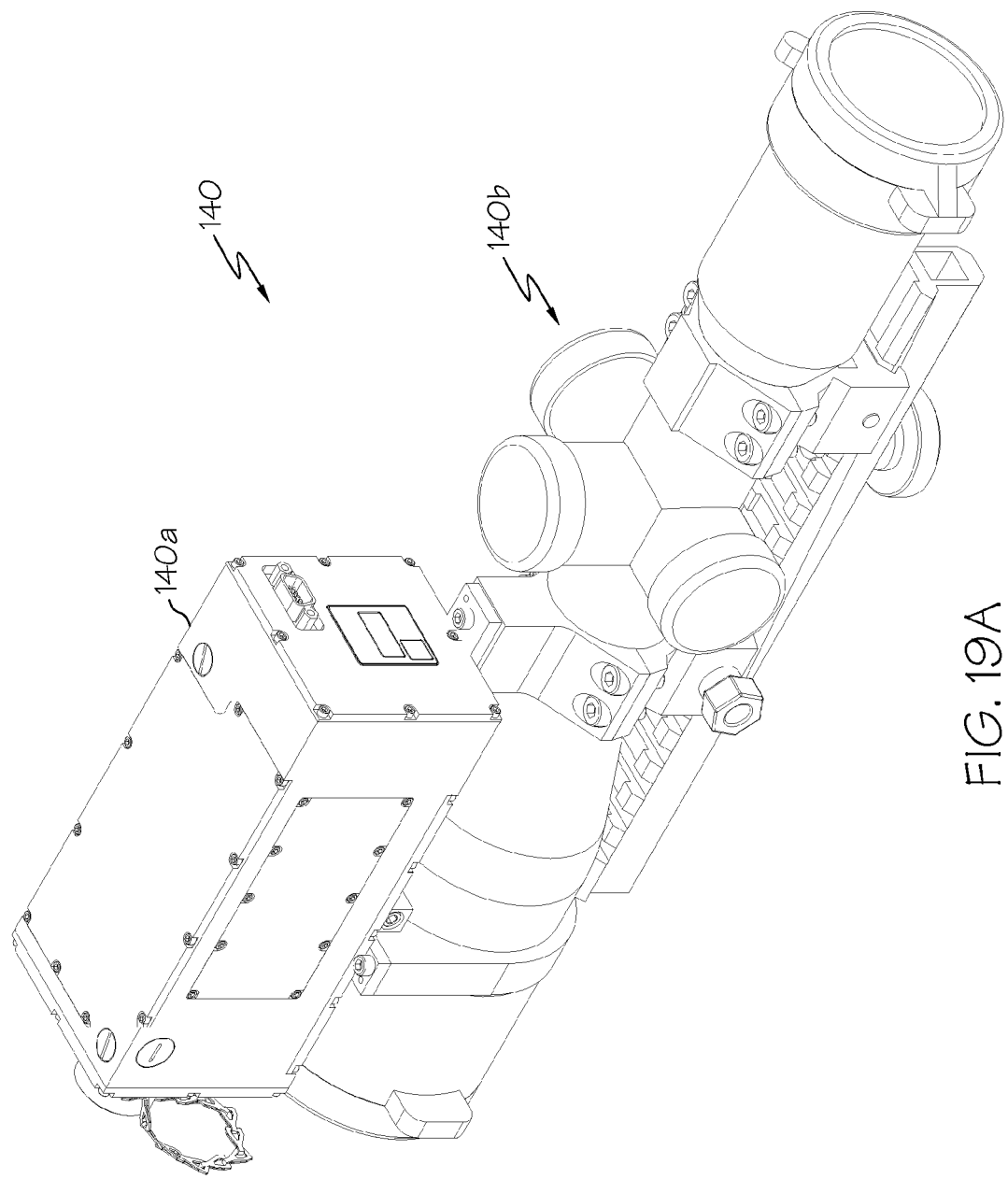
FIGS. 19A-D depict a laser mounted to a rifle scope according to one or more embodiments shown and described herein.
Figure 19B:
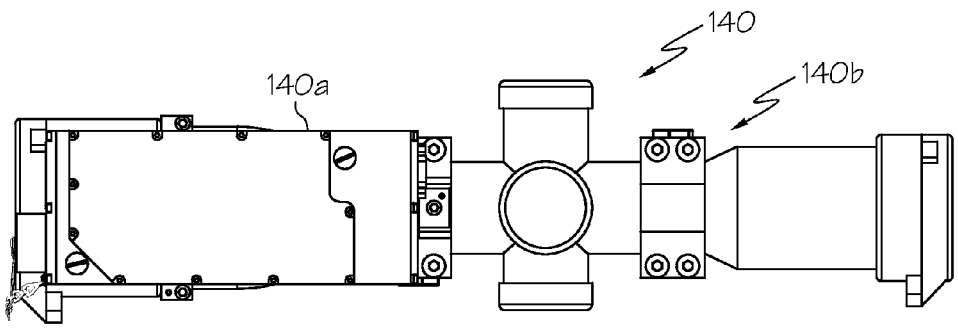
Figure 19C:
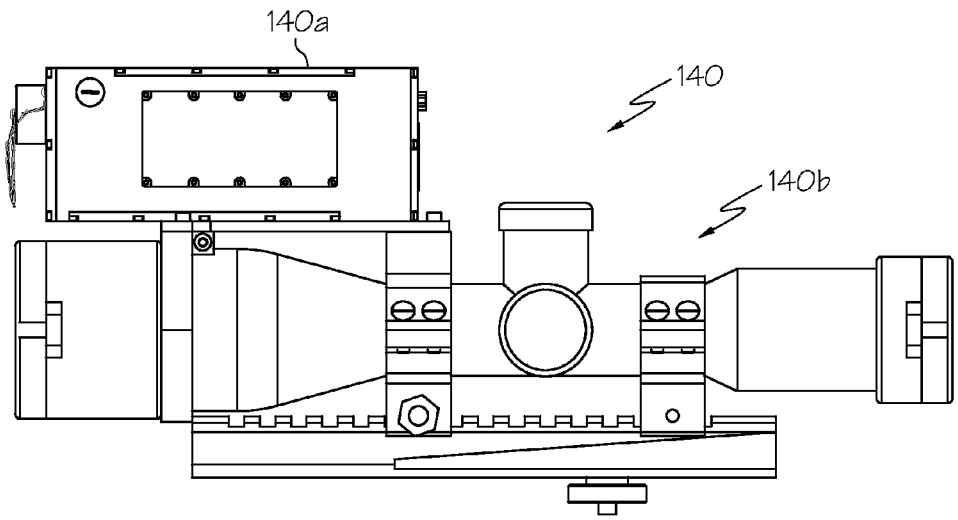
Figure 19D:
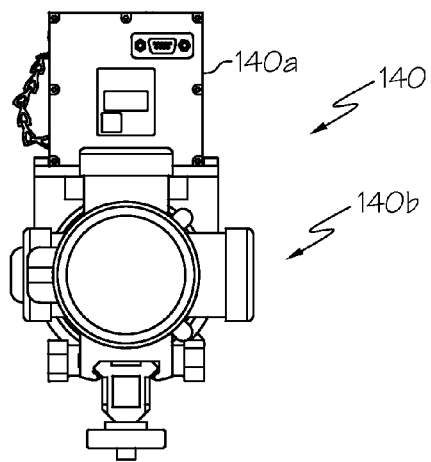

Embodiments of the laser systems described herein may also be mounted in a uni-body housing. For the purposes of this disclosure, a "uni-body housing" is defined as a housing comprising one single (i.e., monolithic) piece of material which is suitably machined (e.g., drilled, hogged out, etc.) so as to be capable of containing some or all of the components of the laser system. FIGS. 18A-C depict a laser 130 having a uni-body housing 130a which may comprise metal, plastic, or composite material. For example, metals such as aluminum or titanium may be used for the uni-body housing 130a Likewise, plastic such as Ultem® 2300 (described below) may be used for the uni-body housing 130a as well. FIG. 18A shows various covers which may be attached to the uni-body housing 130a in order to cover and/or protect the components contained therein, including a top cover 130b, the bottom cover 130c, the front cover 130d, and the rear cover 130e. FIG. 18B also shows a side cover 130f which may cover one or more circuit boards. The laser 130 may include a seal valve 130aa for the electronics and a gas port 130ab for the electronics which may allow contaminants to be removed from the portion of the uni-body housing 130a containing the circuit boards and other electronic components. Likewise, the laser 130 may include a seal valve 130ac for the optics and a gas port 130ad for the optics which may allow contaminants to be removed from the portion of the uni-body housing 130a containing the optical components.

The components of the laser 130 may be disposed inside the uni-body housing 130a as shown in FIGS. 18B and 18C. The arrangement of these components may be such that the laser beam is folded by using one or more corner cubes 130q. The optical components may include an oscillator module 130g, a lens 130h, and a polarizer/Q-switch module 130i. The electronic components may include a bottom capacitor board 130j, an oscillator/amplifier driver board 130k, a Q-switch driver board 130l, a detector board 130m, a folded oscillator control board 130n, a connector board 130o, a top capacitor board 130w, and a top regulator board 130x. As discussed herein, the laser 130 may comprise one or more corner cubes 130q (e.g., four corner cubed in the embodiment of FIG. 18A-C) and one or more compensation waveplates 130p. Within the optical cavity, there may be a waveplate 130r, 130z, a Risley pair 130s, and output coupler 130t, and a lens 130u, 130y. The laser 130 may have a telescope lens 130v as the exit point of the laser beam.

The laser 130 of FIGS. 18A-C may be folded in a similar fashion to the schematic representation of a miniaturized, folded, end pumped, scalable laser of FIG. 17. The laser 130 of FIGS. 18A-C may, however, depict how the laser beam is folded in three dimensions as well as how the laser components (both optical and electrical) may be mechanically coupled to the uni-body housing. With regard to the folding, the laser beam may be reflected by the corner cubes in three dimensions such that the inner space of the uni-body housing is efficiently used. For example, the laser beam may be reflected diagonally across the inside of the housing Likewise, the uni-body housing may have cavities in which the optical and electrical components may be disposed. For example, the housing may have a cavity for each of the corner cubes so that the corner cube is disposed inside the cavity. Similarly, the uni-body housing 130a may have one or more optical channels for the laser beam and reflected laser beams so as to provide a passage therefor. The optical passages may round and may permit other optical components to be disposed therein. For example, an optical passage may be disposed in the uni-body housing 130a so that the optical passage is capable of holding a compensation waveplate 130p. Similarly, the uni-body housing 130a may comprise additional cavities for the electrical components as well such as, for example, the various circuit boards 130j, 130k, 130l, 130m, 130n, 130o, 130w, and 130x. The electrical components may be disposed in these cavities such that they are mounted to the uni-body housing 130a. Thus, the uni-body housing 130a may comprise a single, monolithic structure in which some or all of the electrical and optical components of the laser 130 may be disposed.

The material comprising the uni-body housing 130a of the laser 130 may include metals, plastics, and composite materials which may have approximately the same temperature coefficient of expansion as the gain medium. With regard to metal housings, aluminum and titanium may be used and their external surfaces may serve as convection cooling surfaces. For high average output energy and/or power applications, the metal uni-body housing outer surface may act as a cooling plate for the laser and may be thermally coupled to an active cold plate (e.g., a TEC device and/or a water-cooled heat sink). For plastic housings, a heat-extraction cover (e.g., a top cover 130b, a bottom cover 130c, or a side cover 130f) may be used to remove heat from the laser components (e.g., gain medium and/or pump light sources). For example, a heat-extraction cover may be coupled to the outside world for passive convection cooling (e.g., a heat pipe, solid block, fins, or a strap) or active cooling (e.g., a TEC device and/or a water-cooled heat sink). For plastics, materials such as polyetherides may be used. For example, Ultem® 2300, available from SABIC Americas, Inc., of Houston, Tex., may be used as a housing to which the optical components or modules may be mounted. The properties of Ultem® 2300 are shown in Table 1. Other types of composite materials from other suppliers may be used as well.

TABLE 1

TYPICAL PROPERTIES OF ULTEM ®
TYPICAL PROPERTIES OF ULTEM ®

| ASTM or UL Test | Property | Ultem ® 2300, 30% glass |
|---|---|---|
| PHYSICAL | | |
| D792 | Density (lb/in³) | 0.046 |
| | (g/cm³) | 1.28 |
| D570 | Water Absorption, 24 hrs (%) | 0.25 |
| MECHANICAL | | |
| D638 | Tensile Strength (psi) | 16,500 |
| D638 | Tensile Modulus (psi) | 475,000 |
| D638 | Tensile Elongation at Break (%) | 80 |
| D790 | Flexural Strength (psi) | 20,000 |
| D790 | Flexural Modulus (psi) | 500,000 |
| D695 | Compressive Strength (psi) | 22,000 |
| D695 | Compressive Modulus (psi) | 480,000 |
| D785 | Hardness, Rockwell | M112/R125 |
| D256 | IZOD Notched Impact (ft-lb/in) | 0.5 |
| THERMAL | | |

TABLE 1-continued

TYPICAL PROPERTIES OF ULTEM ®
TYPICAL PROPERTIES OF ULTEM ®

| ASTM or UL Test | Property | Ultem ® 2300, 30% glass |
|---|---|---|
| D696 | Coefficient of Linear Thermal Expansion ($\times 10^{-5}$ in./in./° F.) | 3.1 |
| D648 | Heat Deflection Temp (° F./° C.) at 264 psi | 392/200 |
| D3418 | Glass Transition Temp (° F./° C.) | 419/215 |
| — | Max Operating Temp (° F./° C.) | 340/171 |
| C177 | Thermal Conductivity | |
| | (BTU-in/ft$^2$-hr-° F.) | 0.90 |
| | ($\times 10^{-4}$ cal/cm-sec-° C.) | 3.10 |
| UL94 | Flammability Rating | V-O |
| | ELECTRICAL | |
| D149 | Dielectric Strength (V/mil) short time, ⅛" thick | 830 |
| D150 | Dielectric Constant at 1 MHz | 3.15 |
| D150 | Dissipation Factor at 1 MHz | 0.0013 |
| D257 | Volume Resistivity (ohm-cm) at 50% RH | $6.7 \times 10^{17}$ |

Using plastic or composite materials for the uni-body housing may reduce the overall weight of the laser. Based on one modeling technique, the housing weight ratios are calculated as 130 grams for plastic (e.g., Ultem® 2300) versus conventionally used materials such as aluminum (270 grams) or titanium (460 grams). A uni-body open frame housing may be used (see FIGS. 18A-C) when the laser system is ultimately enclosed in another sealed integrated system housing (e.g., stabilized gimbal, medical equipment, etc.). The optical cavity may be fully sealed and purged in the housing and may contain replaceable desiccant(s). All electronic control cards, diode driver cards, and power supplies, if required, may also be sealed in the uni-body housing. In addition to the weight savings, space savings are also possible. Embodiments may include multiple corner cube folded resonator designs for real life laser designator(s) which may be mounted and used as part of mini or larger gimbals, for optical pumping of optical up-converters (e.g., OPO), or for optical down-converters (e.g., second harmonic generators).

When using a plastic or composite material for the laser housing, it may be necessary to anneal the material in order to remove any moisture which may be contained in the material such as, for example, in the pores of a porous material. Removing the moisture may help prevent the composite material from out gassing, which may (over time) cause the optical components to become coated with the out-gassed material, thus interfering with their operation. After annealing (i.e., removing the moisture), the composite material may be machined to the proper shape (e.g., outside dimensions, cavities, optical channels, etc.) for a housing of the laser system. The machining step may have to be done after the annealing process since the annealing process may slightly deform the shape of the composite material. After machining the composite material to a suitable shape for the housing, the composite material may then be coated with one or more metals to further keep moisture out of the housing (and away from the optical components), as well as providing an electromagnetic shield. The electromagnetic shield may both keep harmful electromagnetic radiation out of the housing and keep any electromagnetic radiation emitted by the laser components inside the housing. The metals used may be copper, nickel, and gold, which may be applied to the outside of the composite material in layers. For example, the copper may be applied first, nickel next, and the gold last. Other types of metals may be used, and different sequences of laying the metal layers may be used as well. The thickness of the metal layers may vary from 50 µm to 200 µm and may be 100 µm in one embodiment.

After applying the metal layers to the outside of the housing, a plastic layer may be applied to the housing (i.e., the outermost metal layer) in order to give the housing, and hence the laser, a particular color or color pattern. For example, in military applications, the plastic layer may have the traditional "camouflage" colors like olive green, beige, and so forth. In other embodiments, the plastic layer may comprise a single solid color such as red. The plastic coating may also be laser etched with certain information like the model number, operating characteristics (e.g., temperature range), serial number, manufacturer, and so forth. The laser etching may prevent the information from being worn off (e.g., through normal use) or from being intentionally filed off. Although typically only the outer surface of the housing is coated with the plastic layer, one or more of the inside surfaces may be coated as well. This may be done, for example, if parts of the inner surface of the housing require additional electrical isolation or insulation.

The lasers described herein may be scalable as well as miniaturized. For example, the gain media (e.g., the end pumped gain medium of FIGS. 3-5 and the side pumped gain medium of FIGS. 10-12) may be made relatively small. In one embodiment, the gain media may be approximately 12 mm in length and approximately 3 mm in height and width. This type of laser may be capable of producing a laser beam of about 15 mJ. In another embodiment, the gain media may be approximately 48 mm in length and approximately 12 mm in height and width. This type of laser may be capable of producing a laser beam of about 240 mJ of energy per pulse for the same length of gain medium or proportionally higher energy when the gain medium length is increased. Likewise, the pump light source (or sources) may also be scaled to match the size of the associated gain medium. That is, the pump light source may be miniaturized to match a miniature gain medium (e.g., 1 or 2 mm in height and width (lasing cross section)), or the pump light source may be increased in size to match a larger gain medium (e.g., 12 mm in height and width (lasing cross section)). There may be no limit to how large or small the gain medium and corresponding pump light sources may be made. In this fashion, the gain medium and pump light sources are scalable to the application.

Similarly, the laser may be scalable by adding amplifier modules to a pump head module. For example, a pump head module having a gain medium with a height and width of 3 mm (e.g., lasing cross section) may be capable of producing a laser beam of about 15 mJ. Adding one amplifier module may increase the power level to about 30 mJ; adding two amplifier modules may increase the power level to about 60 mJ; adding four amplifier modules may increase the power level to about 120 mJ; and adding eight amplifier modules may increase the power level to about 240 mJ. As the energy increases, the lasing cross section of the additional amplifiers may also be increased to avoid potential optical damage of the gain medium itself or the optical coatings on the lasing cross sections surfaces or faces of the gain medium. Thus, the laser may be scalable by adding side pumped amplifier modules to an end pumped pump head module. In this fashion, the laser may be scaled to many types of applications, each requiring different energy and/or power levels.

The embodiments described herein may permit the size and weight of all optical components to be reduced. Due to the major reduction of the size of conventional optics, the use of robust polymer optics may be possible when the lasing cross section of the laser system is enlarged to a size which is big enough to impact overall weight.

The increase in efficiency of the lasers described herein may also allow the size of the laser to be reduced and allow the power requirements to be reduced as well (i.e., for a given output energy and/or power level). For example, optical heads of existing lasers for industrial applications may be about 750 mm in length and about 150 mm in height and width. This corresponds to a volume of about 16,875 cm$^3$ to produce about 200 watts of average power. However, a laser using the embodiments described herein and having the same output power level may only be about 400 mm in length, 100 mm in width, and 65 mm in height. This corresponds to a volume of about 2600 cm$^3$ to produce about 240 mJ of energy per pulse and 240 watts of average power at 1000 Hz. Thus, the embodiments described herein may significantly reduce the volume and weight of the laser for a similar or higher output power level.

The lasers described herein may also have a controller to control their operation and may be contained within the volume of the laser systems described herein. The controller may include one or more electronic circuit boards which may be electrically coupled to each other. The one or more circuit boards may comprise processors, power supplies, pump source driver circuits, or other components necessary for the operation of the laser. The controller may be capable of controlling a pump head module and any number of amplifier modules. In one embodiment, the pump head module and amplifier modules may each comprise the power transistors and discharge capacitors necessary to operate or excite the gain medium of these respective modules. This may permit the controller to be relatively small since it may not be required to have large power components which may allow the controller to be scalable along with the laser itself. Because the controller may be electrically coupled to the one or more amplifier modules, the controller may be able to determine how many amplifier modules are present in the laser. This may be done, for example, through a programmable semiconductor device such as a field programmable gate array (FPGA). Accordingly, the controller may be capable of varying the amount of pump energy delivered to each amplifier module, which may further enhance the flexibility of the laser. The controller may also comprise software which is executed by one or more processors so as to cause the controller to operate the laser in a scalable manner where each amplifier may be synchronized to the oscillator independent of the drive energy required by each module (e.g., a constant current pulse width) and independent of the number of amplifier modules used.

The controller may be designed so as to operate one or more pump light sources, including those in the pump head module as well as those in the one or more amplifier modules, if used. The controller may employ smaller discharge capacitors (which are connected via numerous parallel printed circuit board traces) instead of the three large-size discharge capacitors normally used (e.g., one for the oscillator module and two for the amplifier module) which may reduce the weight and volume of the laser. For example, three of the large discharge capacitors, as conventionally used, may weigh approximately 94.5 grams and have a total capacitance of 16800 μF at 35 volts (e.g., meeting the military voltage maximum of 32 volts). In an embodiment of the disclosure, multiple smaller discharge capacitors may be used, instead of the three larger discharge capacitors, which may reduce the total discharge capacitor network volume by at least 12,000 mm$^3$ for the laser system. The weight, for example, may be reduced from 94.5 grams for the three conventional large capacitors to 65 grams (50 capacitors×1.3 grams each) for the multiple small capacitors used with the present embodiment of the laser system, providing a 10% weight reduction for the 300-gram illustrative laser system. Furthermore, this multi-capacitor network approach may improve the efficiency by reducing the overall lead resistance of the single discharge capacitor having a large capacitance value at peak currents of the pump light source (e.g., 500 A).

In order to further reduce the size and weight of the laser system, the thickness of the electronic circuit boards which make up the controller may be reduced. Also, the electrical components, the wiring harnesses, and customer interface connectors may be selected so as to also reduce size and weight of the laser. For example, an interface connector similar to those found in consumer cellular phones may be used in the laser system and may have a weight of only about 0.6 grams. Multiple pins of the connector may be used in parallel to order to achieve the required current. Other similar light weight and or reduced-volume components may be used as well (e.g., surface-mount components). In addition, proper interfacing of any laser system with its host device (e.g., rifles or unmanned aerial vehicle gimbals) may be a very important part of the packaging technology. The laser systems described herein may be flexible to accommodate miniaturization while still maintaining scalability. The miniaturization aspect of the laser system may allow it to be easily retrofitted into existing application which have a much larger footprint and may facilitate the addition of features not present in the original laser system. For example, a 25-Watt DC/DC converter may be about 51 mm length, about 40.6 mm in width, about 10.2 mm in height, and weight about 48 grams; a 10-Watt DC/DC converter may be about 35.6 mm length, about 22.6 mm in width, about 8.4 mm in height, and weight about 31.4 grams; and a 1-Watt DC/DC converter may be about 19.6 mm length, about 9.9 mm in width, about 6.1 mm in height, and weight about 2.1 grams.

Currently, most laser systems do not contain a sensor or a calibrated output energy detector having a control feedback loop to maintain constant output energy or power. Embodiments of the present disclosure may feature a calibrated internal sensor network with control logic where, at the beginning of each mission (i.e., turn on cycle), the output energy of the laser may be measured (even laser pulses having 10-20 ns duration) and may be adjusted to be the same/constant (e.g., within 5%) within 3 seconds. Output energy monitoring may remain active during the mission, but the compensation may not remain active. Additionally, the laser pump diode driver along with an EO or AO Q-switch may replace the slow, bulky, heavy and inefficient mechanical laser safety shutter used in conventional systems. Not to be limited in theory, the combination of the two may result in a safety turn off response time that may be at least 100 times faster (tens of microseconds) than the time response of the conventional mechanical safety shutter (milliseconds).

The laser system may require numerous voltage levels for proper operation. However, to meet military standard varying input voltage of 18-32 Volts, efficient DC/DC converters may be required to limit, regulate, and control voltage levels of the laser system. For example, a 25-Watt DC/DC converter weighing 48 grams and having one output voltage (although at least three are typically required for the laser system) may make up 10% of the total laser weight. Additionally, the EO or AO Q-switch, the detector sensor board, and the control board may still require isolated power supplies having different voltages due to their operational requirements. Embodiments of the present disclosure may reduce the current and/or voltage requirements due to increased efficiency and scalability. This may allow the DC/DC converter to be reduced in size and weight, thus reducing the size and weight of the corresponding laser system.

FIGS. 19A-D depict one embodiment of a laser/scope assembly 140 which may be mounted to a military rifle, for example. The laser/scope assembly 140 may include a laser 140*a* and a scope 140*b*. The laser 140*a* may comprise one or more of the lasers, pump head modules, amplifier modules, pump light sources, gain media, and/or any combinations thereof described and shown above herein. The laser 140*a* may comprise a uni-body housing as described herein and may be operable to generate a laser beam to be directed toward a target. Within the housing the laser may be folded such that there are three folds. The laser 140*a* may be capable of generating a laser beam having output energy of 10 to 15 mJ, an output pulse width of 16 to 22 ns, a beam diameter of 12 to 14 mm, and a beam divergence of 0.4 to 0.5 milliradians. The laser 140*a* may be capable of generating such a laser beam by using some or all of the novel features described herein. The laser 140*a* may weight between 300 to 500 grams (depending on whether the uni-body housing is plastic or metal) and may be about 110 mm in length and about 50 mm in width and height. The scope 140*b* may magnify the target so as to allow the user to view targets at a distance. The laser 140*a* and the laser/scope assembly 140 may work together so that the scope 140*b* allows the user to view the target while the laser 140*a* simultaneously directs a laser beam at the target.

In one embodiment, a gain medium for a laser comprises a first end, a second end, and four sides comprising a first side, a second side, a third side, and a fourth side, wherein: the four sides are disposed between the first end and the second end such that the first side and the third side oppose each other and the second side and the fourth side oppose each other; the first side and the third side are tapered inwardly from the first end to the first end to the second end at a taper angle β relative to the longitudinal lasing axis and have a polished finish; the second side and the fourth side are substantially parallel to the longitudinal lasing axis, are substantially perpendicular to the first end and the second end, and have a ground blasted finish; and the first side is tilted inwardly at a slant angle α from the fourth side to the second side, the second side is substantially perpendicular to the third side, and the third side is substantially perpendicular to the fourth side. In another embodiment, the first end and the second end of the gain medium are substantially perpendicular to a longitudinal lasing axis of the gain medium and have a polished finish, wherein the first end is operable to be optically coupled to a pump light source.

In another embodiment, a gain medium for a laser comprises a first end, a second end, and four sides comprising a first side having a first aperture area, a second side, a third side having a second aperture area, and a fourth side, wherein: the four sides are disposed between the first end and the second end such that the first side and the third side oppose each other and the second side and the fourth side oppose each other; the first side is substantially perpendicular to the second side, the second side is substantially perpendicular to the third side, the third side is substantially perpendicular to the fourth side, and the fourth side is substantially perpendicular to the first side; the four sides are substantially parallel to the longitudinal lasing axis, are substantially perpendicular to the first end and the second end, have length L parallel to the longitudinal lasing axis, and have a ground blasted finish except in the first aperture area and the second aperture area; the first aperture area and the second aperture area each have a length parallel to the longitudinal lasing axis that is less than or equal to 0.5×L, have a polished finished, and are operable to be optically coupled to a side pump light source; and the first aperture area is disposed in the first side and the second aperture area is disposed in the third side so as to be staggered. In another embodiment, the first end and the second end of the gain medium are substantially perpendicular to a longitudinal lasing axis of the gain medium and have a polished finish.

It should now be understood that the devices and methods described herein may be used to increase the efficiency of a laser, to improve the transfer of heat away from the laser, and to minimize the physical size of the laser while maximizing its output energy/power. The embodiments of the laser described herein may be used in military, medical, and industrial applications. For example, one embodiment may be used as a directed energy weapons system. Other embodiments may be used for electrical power generation such as the manufacturing (or scribing) of solar panels, for separating and enriching uranium isotopes, or for coupling different up-converters or second harmonic generators for specific medical treatments ranging from PDT cancer to hair removal in cosmetics.

While particular embodiments and aspects of the present invention have been illustrated and described herein, various other changes and modifications may be made without departing from the spirit and scope of the invention. Moreover, although various inventive aspects have been described herein, such aspects need not be utilized in combination. It is therefore intended that the appended claims cover all such changes and modifications that are within the scope of this invention.

What is claimed is:

1. A laser comprising an end pump light source and a gain medium having a first end, a second end, and four sides comprising a first side, a second side, a third side, and a fourth side, wherein:
   the end pump light source is optically coupled to the first end and pumps the gain medium;
   the four sides are disposed between the first end and the second end such that the first side and the third side oppose each other and the second side and the fourth side oppose each other;
   the first side and the third side are tapered inwardly from the first end to the second end at a taper angle β relative to a longitudinal lasing axis and have a polished finish capable of reflecting light inside the gain medium;

the second side and the fourth side are substantially parallel to the longitudinal lasing axis, are substantially perpendicular to the first end and the second end, and have a ground blasted finish;

the first side is tilted inwardly at a slant angle α from the fourth side to the second side, the second side is substantially perpendicular to the third side, and the third side is substantially perpendicular to the fourth side; and a laser beam $R_0$ exits the second end of the gain medium.

2. The laser of claim 1, wherein the first end and the second end are substantially perpendicular to the longitudinal lasing axis of the gain medium and have a polished finish.

3. The laser of claim 1, wherein the gain medium comprises a crystal having yttrium, aluminum, and garnet (YAG); yttrium, vanadate, and oxygen ($YVO_4$); or yttrium, lithium, and fluorine (YLF); and wherein the crystal is doped with neodymium (Nd), erbium (Er), or ytterbium (Yb).

4. The laser of claim 1, wherein the taper angle β is approximately 0.5 degrees to approximately 5.0 degrees, and the slant angle α is approximately 0.5 degrees to approximately 5.0 degrees.

5. The laser of claim 1, further comprising a Q-switch optically coupled to the second end of the gain medium and operable to facilitate pulsed operation of the laser.

6. The laser of claim 1, wherein the end pump light source comprises a transverse pump light source.

7. The laser of claim 1, further comprising a Q-switch optically coupled to the second end of the gain medium and operable to facilitate pulsed operation of the laser.

8. The laser of claim 7, further comprising one or more amplifier modules, each amplifier module comprising an additional gain medium and two side pump light sources, wherein:

the additional gain medium comprises an additional first end, an additional second end, and four additional sides comprising an additional first side having a first aperture area, an additional second side, an additional third side having a second aperture area, and an additional fourth side;

the additional first end and the additional second end are substantially perpendicular to an additional longitudinal lasing axis of the additional gain medium and have a polished finish;

the four additional sides are disposed between the additional first end and the additional second end such that the additional first side and the additional third side oppose each other and the additional second side and the additional fourth side oppose each other;

the additional first side is substantially perpendicular to the additional second side, the additional second side is substantially perpendicular to the additional third side, the additional third side is substantially perpendicular to the additional fourth side, and the additional fourth side is substantially perpendicular to the additional first side;

the four additional sides are substantially parallel to the additional longitudinal lasing axis, are substantially perpendicular to the additional first end and the additional second end, have length L parallel to the additional longitudinal lasing axis, and have a ground blasted finish except in the first aperture area and the second aperture area;

the first aperture area and the second aperture area each have a length parallel to the additional longitudinal lasing axis that is less than or equal to 0.5×L, have a polished finished, and are optically coupled to each of the two side pump light sources such that the two side pump light sources pump the additional gain medium;

the first aperture area is disposed in the additional first side and the second aperture area is disposed in the additional third side so as to be staggered; and the additional first end or the additional second end of the one or more amplifier modules are optically coupled to the Q-switch or optically coupled to each other so as to amplify the laser beam $R_0$ emitted by the laser.

9. The laser of claim 8, wherein side pump light sources for the first aperture area or the second aperture area of at least one of the one or more amplifier modules is a transverse diode light source.

10. The laser of claim 9, wherein the transverse diode light source comprises a plurality of diode bars emitting light at a plurality of wavelengths.

11. The laser of claim 1, further comprising a uni-body housing and a plurality of corner cubes comprising N corner cubes, wherein:

the uni-body housing comprises a plurality of cavities, wherein the end pump light source, the gain medium, and the plurality of corner cubes are disposed in the plurality of cavities and mechanically coupled to the uni-body housing;

the laser beam $R_0$ is optically coupled to one of the plurality of corner cubes, and the plurality of corner cubes are optically coupled to each other so as to reflect the laser beam $R_0$ within the uni-body housing, creating a plurality of reflected laser beams $R_1 \ldots R_N$;

the plurality of reflected laser beams $R_1 \ldots R_N$ are not disposed in the same plane;

a plurality of optical channels comprising N+1 optical channels are disposed in the uni-body housing so as to provide a passage for the laser beam $R_0$ and the plurality of reflected laser beams $R_1 \ldots R_N$; and a last of the plurality of reflected laser beams $R_N$ exits the uni-body housing as an output laser beam from the laser.

12. The laser of claim 1, further comprising a uni-body housing and a plurality of corner cubes comprising N corner cubes, wherein:

the uni-body housing comprises a plurality of cavities and a heat-extraction cover, wherein the end pump light source, the gain medium, and the plurality of corner cubes are disposed in the plurality of cavities and mechanically coupled to the uni-body housing, and the heat-extraction cover is mechanically coupled to one side of the uni-body housing;

the end pump light source and the gain medium are thermally coupled to the heat-extraction cover such that the heat-extraction cover removes heat from the end pump light source and the gain medium;

the laser beam $R_0$ is optically coupled to one of the plurality of corner cubes, and the plurality of corner cubes are optically coupled to each other so as to reflect the laser beam $R_0$ within the uni-body housing, creating a plurality of reflected laser beams $R_1 \ldots R_N$;

the plurality of reflected laser beams $R_1 \ldots R_N$ are not disposed in the same plane;

a plurality of optical channels comprising N+1 optical channels are disposed in the uni-body housing so as to provide a passage for the laser beam $R_0$ and the plurality of reflected laser beams $R_1 \ldots R_N$; and a last of the plurality of reflected laser beams $R_N$ exits the uni-body housing as an output laser beam from the laser.

13. A laser comprising an end pump light source and a gain medium having a first end, a second end, and four sides comprising a first side, a second side, a third side, and a fourth side, wherein:

the first end and the second end are substantially perpendicular to a longitudinal lasing axis of the gain medium and have a polished finish;

the four sides are disposed between the first end and the second end such that the first side and the third side oppose each other and the second side and the fourth side oppose each other;

the first side and the third side are tapered inwardly from the first end to the second end at a taper angle β relative to the longitudinal lasing axis and have a polished finish capable of reflecting light inside the gain medium;

the second side and the fourth side are substantially parallel to the longitudinal lasing axis, are substantially perpendicular to the first end and the second end, and have a ground blasted finish;

the first side is tilted inwardly at a slant angle α from the fourth side to the second side, the second side is substantially perpendicular to the third side, and the third side is substantially perpendicular to the fourth side;

the end pump light source comprises a plurality of light-emitting diodes producing light at a plurality of wavelengths;

the end pump light source is optically coupled to the first end of the gain medium, pumps the gain medium, and is oriented such that light exiting the end pump light source at a relatively high exit angle is directed toward the first side and the third side; and a laser beam exits the second end of the gain medium.

14. The laser of claim 13, wherein each of the plurality of light-emitting diodes of the end pump light source has a transverse axis T-T', and wherein each of the plurality of light-emitting diodes is positioned relative the gain medium such that the transverse axes T-T' are transverse to the lasing axis L-L'.

\* \* \* \* \*

UNITED STATES PATENT AND TRADEMARK OFFICE
CERTIFICATE OF CORRECTION

PATENT NO.        : 8,204,094 B2  
APPLICATION NO.   : 12/732746  
DATED             : June 19, 2012  
INVENTOR(S)       : M. Cem Gokay It is certified that error appears in the above-identified patent and that said Letters Patent is hereby corrected as shown below:

On the Title page, Item (57) Abstract:

"are substantially parallel to the longitudinal lasing axis have a" should read
-- are substantially parallel to the longitudinal lasing axis and have a --

Col. 27, Line 65, Claim 8, "polished finished" should read -- polished finish --

Signed and Sealed this
Eighteenth Day of December, 2012

David J. Kappos
*Director of the United States Patent and Trademark Office*